US010829354B2

(12) United States Patent
Lesquir

(10) Patent No.: US 10,829,354 B2
(45) Date of Patent: Nov. 10, 2020

(54) COLLISION AVOIDANCE ASSISTANCE SYSTEM FOR MOVABLE WORK PLATFORMS

(71) Applicant: Amova Sàrl, Lentzweiler (LU)

(72) Inventor: François Lesquir, Limerle (BE)

(73) Assignee: CTI SYSTEMS S.A.R.L., Lentzweiler (LU)

( * ) Notice: Subject to any disclaimer, the term of this patent is extended or adjusted under 35 U.S.C. 154(b) by 320 days.

(21) Appl. No.: 15/960,390

(22) Filed: Apr. 23, 2018

(65) Prior Publication Data

US 2019/0185304 A1    Jun. 20, 2019

(30) Foreign Application Priority Data

Dec. 20, 2017   (LU) ........................................ 100588

(51) Int. Cl.
*B66F 11/04*        (2006.01)
*G06T 17/00*       (2006.01)
(Continued)

(52) U.S. Cl.
CPC ................ *B66F 11/04* (2013.01); *B64F 5/10* (2017.01); *G06F 30/13* (2020.01); *G06F 30/15* (2020.01);
(Continued)

(58) Field of Classification Search
CPC ...... B66F 11/04; B66F 11/046; B66F 17/006; G06F 30/13; G06F 30/15; G06T 17/00;
(Continued)

(56) References Cited

U.S. PATENT DOCUMENTS 4,654,087 A * 3/1987 Fujita ........................ B64F 5/30
                                                      134/25.4
4,668,301 A * 5/1987 Takigawa .................. B64F 5/30
                                                      134/6
(Continued)

FOREIGN PATENT DOCUMENTS

| DE | 2332075 A1 | 1/1974 |
|---|---|---|
| DE | 102012006371 A1 | 7/2012 |
| WO | 2012004232 A2 | 1/2012 |

OTHER PUBLICATIONS

Search Report issued in connection with Luxembourg Application No. LU100766 dated Oct. 29, 2018.

*Primary Examiner* — Sze-Hon Kong
(74) *Attorney, Agent, or Firm* — Steven M. Shape; Dennemeyer & Associates, LLC

(57) ABSTRACT

The present invention relates to an apparatus and a method for generating a cloud of points (1A) representative of the real outer shape of a human transportation vehicle (1) located in a building (4) and for determining the position and orientation of said human transportation vehicle (1) in said building (4) and for determining the relative position and orientation of at least one movable work platform (2), the position and orientation of said human transportation vehicle (1) and the position and orientation of said movable work platform (2) being referenced with respect to at least one known building (4) reference point (R1), said apparatus being for preventing collisions between the movable work platform (2) and the human transportation vehicle (1), said apparatus comprising:
  at least one known building reference point (R1) being the origin point of a 6 degrees of freedom coordinate system and serving as a central common reference point, and
(Continued)

at least one three-dimensional scanning means (3) for determining said real outer shape of said human transportation vehicle (1), and at least one stationary calculator means (6) for generating said cloud of points (1A) representative of the real outer shape of the human transportation vehicle (1), and one known movable work platform (2) reference point (R2) located on said movable work platform (2), and at least one setting means (8) for setting the position and orientation up to 6 degrees of freedom of the movable work platform (2) according to reference point (R2) with respect to the reference point (R1), and at least one first processor (21) for generating a three dimensional model (2A) representative of the movable work platform (2), and said first processor (21) for determining the up to 6 degrees of freedom position and orientation of said three dimensional model (2A) representative of said movable work platform (2), and the three-dimensional scanning means (3), the setting means (8), the stationary calculator means (6) and the first processor (21) being linked together via a communication means, and said first processor (21) being for preventing collisions between the movable work platform (2) and the human transportation vehicle (1).

20 Claims, 19 Drawing Sheets

(51) Int. Cl.
| | |
|---|---|
| B64F 5/10 | (2017.01) |
| G06T 7/73 | (2017.01) |
| G06F 30/13 | (2020.01) |
| G06F 30/15 | (2020.01) |
| G01S 17/42 | (2006.01) |

(52) U.S. Cl.
CPC ............... *G06T 7/75* (2017.01); *G06T 17/00* (2013.01); *G01S 17/42* (2013.01); *G06T 2207/10028* (2013.01); *G06T 2207/30261* (2013.01); *G06T 2210/56* (2013.01)

(58) Field of Classification Search
CPC ............ G06T 7/75; G06T 2210/56; G06T 2207/10028; G06T 2207/30261; B64F 5/10; G01S 17/42; G01S 17/93; G01S 17/87; G01S 17/89

See application file for complete search history.

(56) References Cited

U.S. PATENT DOCUMENTS

| | | | | |
|---|---|---|---|---|
| 5,138,904 | A | * | 8/1992 | Lande ................ B05B 13/0431 74/661 |
| 5,161,557 | A | * | 11/1992 | Scheiter, Jr. ............. B60S 3/04 134/123 |
| 5,248,341 | A | * | 9/1993 | Berry, Jr. ............ B05B 13/0431 105/163.2 |
| 5,359,542 | A | | 10/1994 | Pahmeier et al. |
| 5,363,940 | A | * | 11/1994 | Fahrion .................... B64F 5/10 182/115 |
| 5,769,954 | A | * | 6/1998 | Wanner .................... B08B 1/04 134/6 |
| 5,833,762 | A | * | 11/1998 | Wanner .................... B08B 1/04 134/18 |
| 6,134,734 | A | * | 10/2000 | Marrero .................... B60S 3/00 15/53.1 |
| 6,311,434 | B1 | * | 11/2001 | Nelson ................... B64F 1/222 296/26.04 |
| 8,483,356 | B2 | * | 7/2013 | Bendahan ............ G01N 23/203 378/57 |
| 9,045,318 | B1 | * | 6/2015 | Polus ..................... B66C 13/30 |
| 10,222,455 | B1 | * | 3/2019 | Stieff ...................... G01S 17/88 |
| 2009/0112349 | A1 | * | 4/2009 | Cobb ......................... B64F 5/10 700/114 |
| 2011/0010007 | A1 | * | 1/2011 | Sarh .......................... B25J 9/08 700/248 |
| 2015/0343473 | A1 | * | 12/2015 | Mathis ..................... B64F 5/50 427/427.2 |
| 2017/0010383 | A1 | * | 1/2017 | Mircea ................... G01V 5/005 |
| 2017/0341235 | A1 | | 11/2017 | Baloch et al. |
| 2019/0100420 | A1 | * | 4/2019 | Perlstein ................... B66F 7/26 |
| 2020/0171527 | A1 | * | 6/2020 | Shiwa ....................... B25J 9/04 |
| 2020/0198154 | A1 | * | 6/2020 | Shiwa ................. B25J 11/0065 |

* cited by examiner

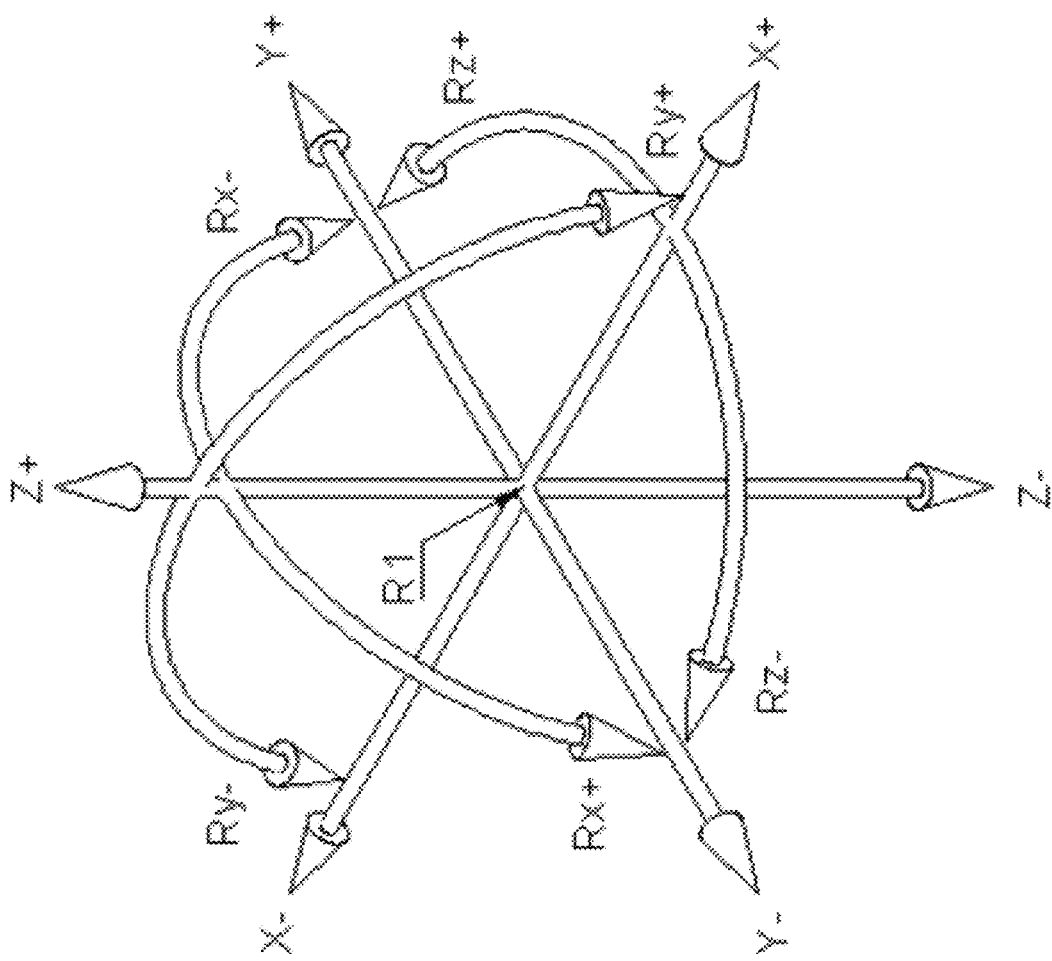

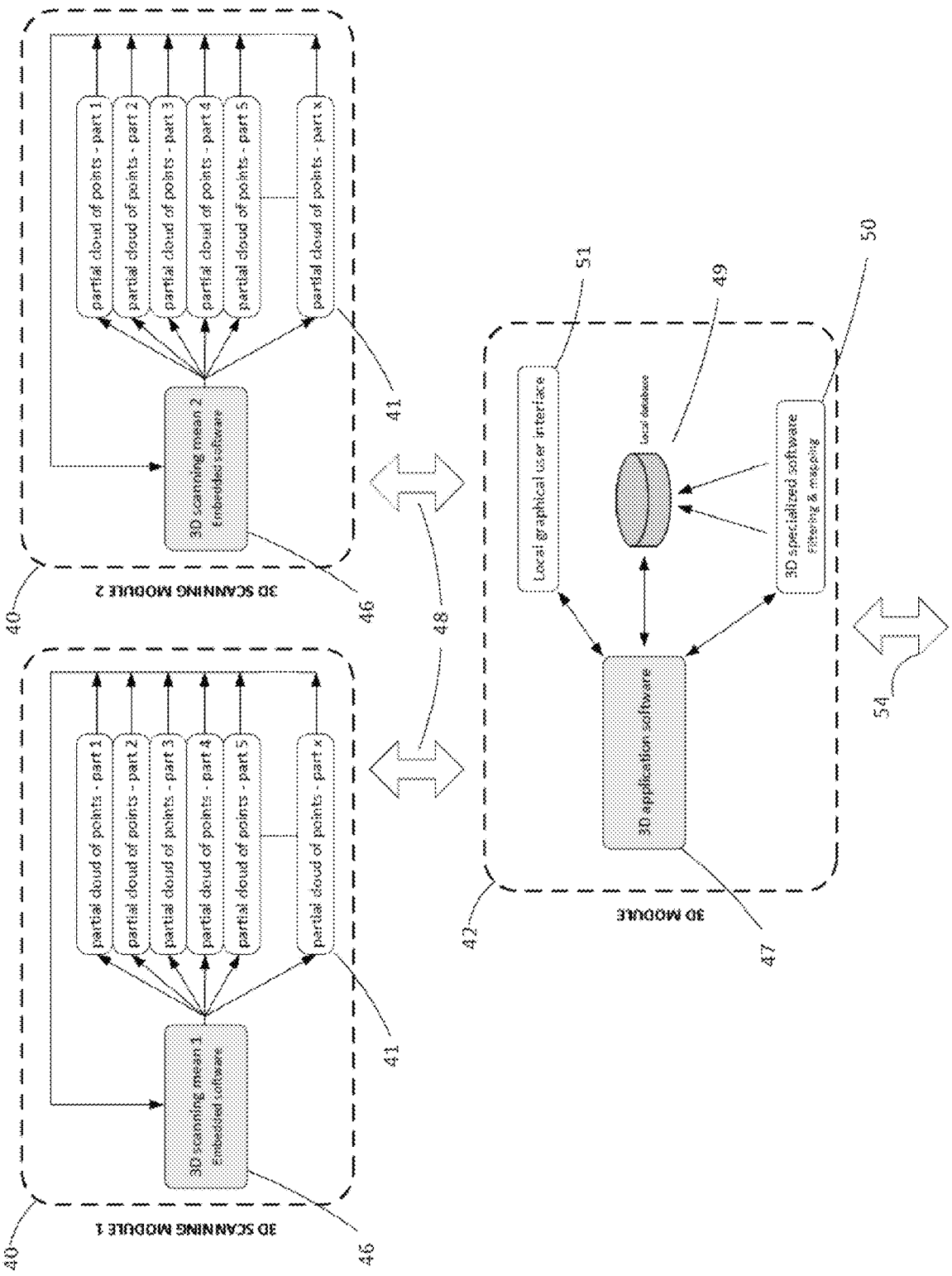

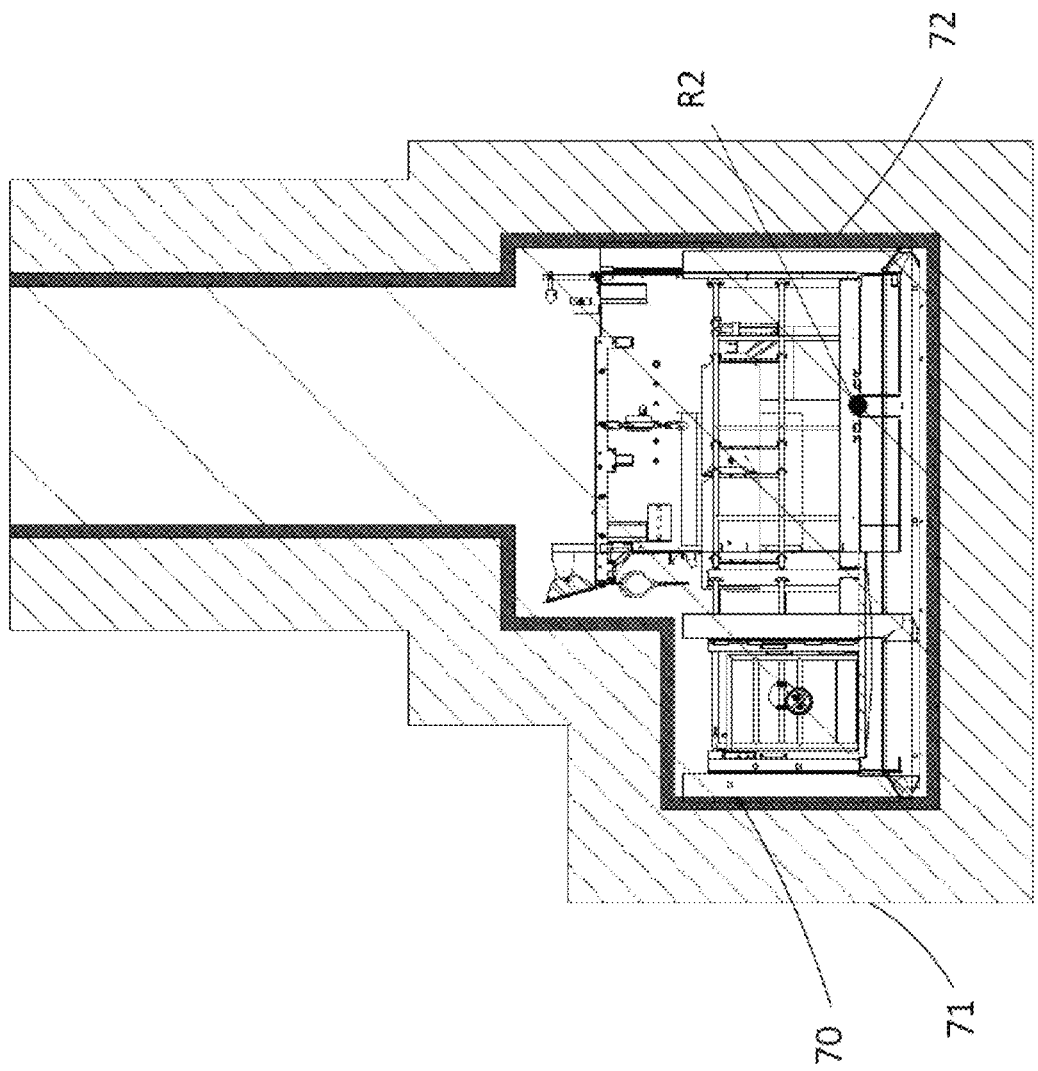

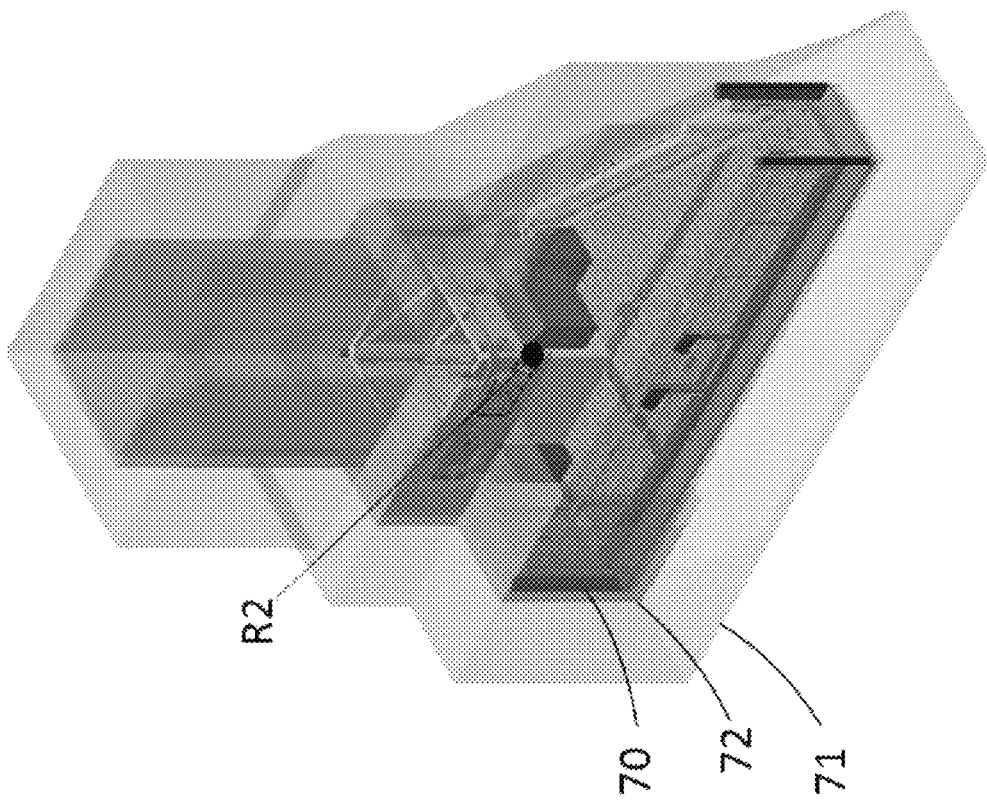

COLLISION AVOIDANCE ASSISTANCE SYSTEM FOR MOVABLE WORK PLATFORMS

The present invention relates to the field of position determination and collision avoidance between a movable work platform (MVP) and a human transportation vehicle (HTV).

The closest state of the art is U.S. Pat. No. 5,359,542 which relates to a system for determining the position of an airplane in a hangar and for limiting the motion of a plurality of gantry cranes around the airplane, the system including a plurality of movable scanners which ascertain locations of a plurality of collinear points along the leading edges of the wings of the airplane, including a processor system for determining a point of intersection of lines through the collinear points, the point of intersection and lines having a known positional relationship with the other portions of the airplane from which the processor system also determines the locations of other portions of the airplane, the processor system determining limits on the cranes' motion relative to the airplane.

WO 2007101475 concerns an automated system with suspended robot for treating surfaces, in particular of aircraft, comprising a support P consisting of a travelling crane, a mobile carriage on the travelling crane, and a telescopic mast borne by the carriage and extending downwards of the latter. A treatment robot is supported by the mast at its lower end. The system is equipped with indoor GPS locating means including several transmitters arranged height wise on columns secured to the ground and independent of a shed in which the treating system is installed, receivers supported by the telescopic mast and receivers to be fixed in noticeable points of the object, so as to detect the position of a reference point of the robot in a space of treatment to be measured and the position of noticeable points of the object in said space of treatment, and means for signaling the detected position of the reference point and of noticeable points of the object to a system controlling the support and the robot based on the detected positions and based on the three-dimensional shape of the object stored in the management system.

A single collision between a movable work platform and a human transportation vehicle can be very costly and also dangerous for the human being positioned on the work platform.

The closest prior art is U.S. Pat. No. 5,359,542 because it concerns the same field and a similar problem to be solved.

The differences between U.S. Pat. No. 5,359,542 and the present invention are:

An apparatus for generating a cloud of points (1A) representative of the real outer shape of a human transportation vehicle (1) for determining the orientation of said human transportation vehicle (1) in said building and for determining the relative orientation of at least one movable work platform (2), the orientation of said human transportation vehicle (1) and the orientation of said movable work platform (2) being referenced with respect to at least one known building (4) reference point (R1), said apparatus comprising:

- at least one said known building (4) reference point (R1) being the origin point of a 6 degrees of freedom coordinate system and serving as a central common reference point, and
- at least one three-dimensional scanning means (3) for determining said real outer shape of said human transportation vehicle (1), and
- at least one stationary calculator means (6) for generating said cloud of points (1A) representative of the real outer shape of the human transportation vehicle (1), and
- said setting means (8) settles the orientation up to 6 degrees of freedom of the movable work platform (2) according to reference point (R2) with respect to the reference point (R1), and
- at least one first processor (21) for generating a three dimensional model (2A) representative of the movable work platform (2), and
- said first processor (21) for determining the up to 6 degrees of freedom position and orientation of said three dimensional model (2A) representative of said movable work platform (2), and
- the three-dimensional scanning means (3), the setting means (8), the stationary calculator means (6) and the first processor (21) being linked together via a communication means, and
- said first processor (21) being used for preventing collisions between the movable work platform (2) and the human transportation vehicle (1).

The technical effect of the differences between U.S. Pat. No. 5,359,542 and the present invention is to generate a cloud of points (1A) representative of the real outer shape of a human transportation vehicle (1). The technique using a cloud of points is a new technology not available at the filing date of U.S. Pat. No. 5,359,542, which is much improved since it can additionally scan protuberances of the HTV (1) like an antenna, which is not possible in U.S. Pat. No. 5,359,542.

The objective technical problem to be solved is to provide an alternative improved apparatus for preventing collisions between the movable work platform (2) and the human transportation vehicle (1).

Referring to U.S. Pat. No. 5,359,542 (also referred to as "the Boeing patent"), the following major differences to the present invention are:

A) In the Boeing patent the airplane (obstacle) surface is defined in two portions, firstly the "portion scanned" (by sensing 4 wing edges by photocells and by sight gauging the height, to determine the position of the airplane in the hangar) and secondly the "Another portion of the aircraft" (CATIA drawings are manually converted and engineered into PLC specific data blocks). In the present invention the complete airplane surface is defined by one 3D LIDAR based scan session. The scan session is resulting in a cloud of points. The cloud of points is automatically referenced to stationary fixed calibrated reference targets and to the hangar.

B) In the Boeing patent the PLC specific data blocks of the "other portion of the aircraft", based on the CATIA model of the airplane, require to be created by engineering, being a considerable job, to be redone manually for each different aircraft type (Visually identify the location of "station lines" and cut the model in "station lines" (X); Visually identify the location of "water lines" (Z) at specific places over the skin; Manually design, calculate and create the data for each data block (circle origin point, initial radius, anchor line, taper multiplier, ellipse origin, ellipse gain values; Manually engineer application software, mainly based on trigonometry, to real time calculate distances, for specific areas of the skin; Additional data sets are manually created by engineering for the different flaps positions). In the present invention the post treatment of the resulting point cloud is an automatic process, performed by software, independently of the aircraft type (Filtering the point cloud automatically; Adding shapes (skirts) automatically; Creating the ready to use complete airplane data automatically).

C) In the Boeing patent the airplane data is defined in data blocks one time per airplane model and the same data is always reused for the same physical airplane type. In the present invention the airplane is rescanned at each entry in the hangar.

D) In the Boeing patent the principle of anti-collision detection works by comparing position of the base structure corners and impact points of the movable work platform with a calculated surface of the airplane. In the present invention the principle of anti-collision detection works by calculating penetrations of any points measured and belonging to the real outer surface/shape of the Human Transportation Vehicle, for example an aircraft, into a virtual 3D model representing the movable work platform, including all physical boundaries like working surface, handrails, fixations and other appendices, and including its supporting or suspended mast if any.

E) In the Boeing patent all additional "other objects" are supposed to be planned at fixed locations, for example the potential areas where trash bins are located, need to be planned, marked on the floor and pre-engineered inside the data blocks. In the present invention any other object can be additionally scanned during the 3D scan session and can be automatically added to the point cloud. This means, that new obstacles, being present at a certain location can be automatically integrated.

F) The Boeing patent has no solution for extraordinary protuberant parts. In the present invention, if the HTV has extraordinary small protuberance parts (e.g. antennae's, . . . ), that need to be scanned in higher resolution, then the 3D scanner can be switched to high resolution, and the specific protuberances can be additionally scanned. The resulting point cloud will be automatically inserted into the main point cloud.

G) In the Boeing patent, anti-collision is performed between the platforms, by using ultrasonic sensors on the level of the bridge motion, surveying the relative distance between two adjacent bridges in a wide range. In the present invention the anti-collision assistance between work platforms is permanently performed by the on board controllers, by mutually surveying the relative position and orientation to other adjacent work platforms, not only by mutual bridge distance verification, but based on the actual locations (coordinates) of the implied movable work platform origin points.

SUMMARY OF THE INVENTION

The present invention relates to an apparatus for generating a cloud of points (1A) representative of the real outer shape of a human transportation vehicle (1) located in a building (4) and for determining the position and orientation of said human transportation vehicle (1) in said building (4) and for determining the relative position and orientation of at least one movable work platform (2), the position and orientation of said human transportation vehicle (1) and the position and orientation of said movable work platform (2) being referenced with respect to at least one known building (4) reference point (R1), said apparatus being for preventing collisions between the movable work platform (2) and the human transportation vehicle (1), said apparatus comprising:

at least one known building (4) reference point (R1) being the origin point of a 6 degrees of freedom coordinate system and serving as a central common reference point, and at least one three-dimensional scanning means (3) for determining said real outer shape of said human transportation vehicle (1), and at least one stationary calculator means (6) for generating said cloud of points (1A) representative of the real outer shape of the human transportation vehicle (1), and one known movable work platform (2) reference point (R2) located on said movable work platform (2), and at least one setting means (8) for setting the position and orientation up to 6 degrees of freedom of the movable work platform (2) according to reference point (R2) with respect to the reference point (R1), and at least one first processor (21) for generating a virtual three dimensional model (2A) representative of the movable work platform (2), and said first processor (21) for determining the up to 6 degrees of freedom position and orientation of said three dimensional model (2A) representative of said movable work platform (2), and the three-dimensional scanning means (3), the setting means (8), the stationary calculator means (6) and the first processor (21) being linked together via a communication means, and said first processor (21) being used for preventing collisions between the movable work platform (2) and the human transportation vehicle (1).

Preferably, said three-dimensional scanning means (3) refers to at least two building reference targets (S1, S2, S3, S4, S5, S6, S7, S8, S9, S10), themselves referring to the at least one known building reference point (R1).

Preferably, only one or at least one movable work platform (2) is located on each side of the longitudinal axis of the human transportation vehicle (1).

Preferably, 2, 3, 4, or 5 movable work platform (2) are located on each side of the longitudinal axis of the human transportation vehicle (1).

Preferably, the movable work platform (2) is either a building-roof suspended work platform or a ground anchored work platform or a wheeled work platform or a combination of a building-roof suspended work platform and a ground anchored work platform and a wheeled work platform.

Preferably, the movable work platform (2) is automatically or manually controlled.

Preferably, the at least one movable work platform (2) carries one or a plurality of printing apparatus or of camera or of robot or of surface treatment apparatus or of human or a combination of a printing apparatus and a camera and a robot and a surface treatment apparatus and a human.

Preferably, the human transportation vehicle (1) can be an aircraft, an helicopter, a rocket, a space shuttle, a space launcher, a train, a car, a bus or a ship or a part of any of the previously mentioned human transportation vehicles (1).

Preferably, the apparatus comprises calibrated reference targets (S1, S2, S3, S4, S5, S6, S7, S8, S9, S10) which are located at non movable locations of the building (4) during the generation of the cloud of points (1A).

Preferably, the three-dimensional scanning means (3) can be carried by said movable work platform (2) or not during the generation of the cloud of points (1A).

Preferably, the communication means is based on an Ethernet based LAN (30) or WLAN (31, 32) infrastructure.

Preferably, the stationary calculator means (6) comprises at least one main server (10), and at least one second processor (20) for three dimensional data processing per three dimensional scanning means (3), and at least one first processor (21) for anti-collision management, and at least one Graphical User Interface desktop (11) and an Ethernet infrastructure (30,31,32) linking all together.

The present invention relates to the use of the apparatus for preventing collisions between said at least one movable work platform (2) and said human transportation vehicle (1).

Preferably, the movable work platform (2) onboard first processor (21), compares the position of single points of the generated cloud of points (1A) with the position and orientation of the three dimensional model (2A), so that when a risk of collision is detected between the movable work platform (2) and the human transportation vehicle (1), a predetermined deceleration curve up to full stop to mandatorily respect a predetermined minimum distance to physical contact between any part of the human transportation vehicle (1) and the movable work platform (2) is realized.

Preferably, the minimal distance between the movable work platform (2) and the human transportation vehicle (1) is between 100 mm and 200 mm, preferably 150 mm.

Preferably, the apparatus is for realizing a Dynamic Path Planning (DPP) for the at least one movable work platform (2) to partially or fully automate manual controlled motions of said movable work platform (2) towards and along the human transportation vehicle (1) based on pre-programmed trajectories.

The present invention relates to a method for generating a cloud of points (1A) representative of the real outer shape of a human transportation vehicle (1) located in a building (4) and for determining the position and orientation of said human transportation vehicle (1) in said building and for determining the relative position and orientation of at least one movable work platform (2) up to 6 degrees of freedom, said method being for preventing collisions between the movable work platform (2) and the human transportation vehicle (1) as defined in claim 1, said method comprising the steps of:

A) determining said known building (4) reference point (R1) being the origin point of a 6 degrees of freedom coordinate system and serving as a central common reference point, and B) determining the real outer shape of said human transportation vehicle (1) via at least one three-dimensional scanning means (3), and C) generating a cloud of points (1A) representative of the real outer shape of the human transportation vehicle (1) via at least one stationary calculator means (6), and D) determining a known movable work platform (2) reference point (R2) located on said movable work platform (2), and E) settling the position and orientation up to 6 degrees of freedom of the movable work platform (2) according to reference point (R2) with respect to the reference point (R1) via at least one setting means (8), F) generating a three dimensional model (2A) representative of the movable work platform (2) via at least one first processor (21), and G) determining the up to 6 degrees of freedom position and orientation of said three dimensional model (2A) representative of said movable work platform (2) via the first processor (21), and H) communicating between the three-dimensional scanning means (3), the setting means (8), the stationary calculator means (6) and the first processor (21) via a communication means.

I) comparing the position of single points of the generated cloud of points (1A) with the position and orientation of the three dimensional model (2A) to detect a risk of collision between the movable work platform (2) and the human transportation vehicle (1).

Preferably, the method has an additional step J) being respecting a predetermined deceleration curve up to full stop to mandatorily respect a predetermined minimum distance to physical contact between any part of the human transportation vehicle (1) and the movable work platform (2), via the first processor (21).

Preferably, steps B) and C) of said method take between 60 minutes and 80 minutes.

Preferably, steps B) and C) and I) of said method have a resolution of cloud of points (1A) of the human transportation vehicle (1) comprised between 10 mm and 50 mm.

DESCRIPTION OF THE FIGURES

FIG. 6B is a schematic view of the six degrees of freedom coordinate system relative to R1.

FIG. 14A shows a side view of virtual core (70) and safety shells (71, 72) and R2 representative of a MWP (2).

FIG. 14D shows a perspective view of virtual core (70) and safety shells (71, 72) representative of a building-roof suspended movable work platform (2) and of R2.

DETAILED TECHNICAL DESCRIPTION

Figure 1:
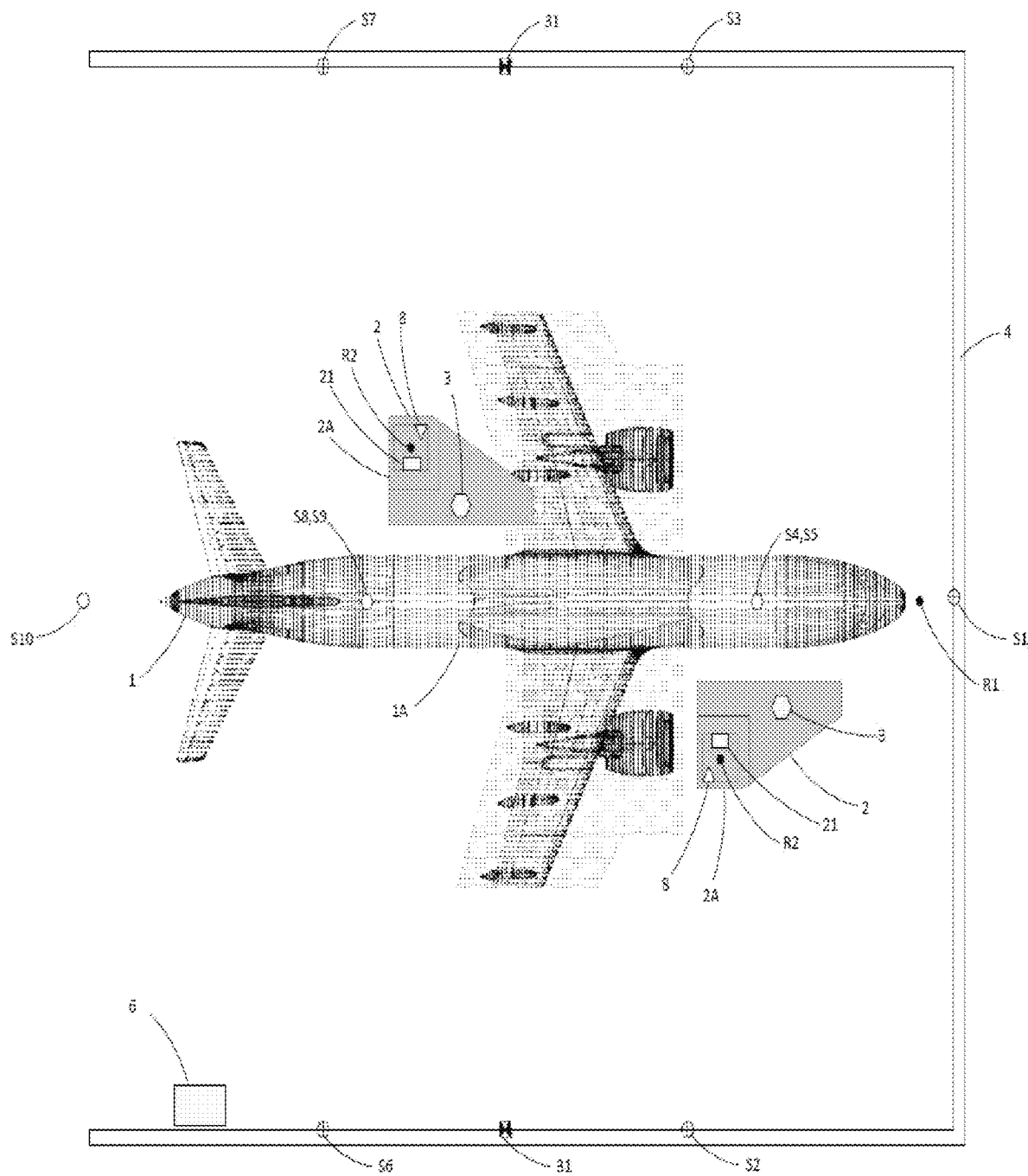
FIG. 1 shows a top view of a cloud of points (1A) representing a Human Transportation Vehicle (1) in a building (4) and one movable work platform (MWP) (2) on each longitudinal side of the Human Transportation Vehicle (HTV) (1), for example an aircraft, as well as all means essential for carrying out the present invention. The movable work platform (2) moves along the HTV (1) without being in contact with the HTV (1).
Figure 2:
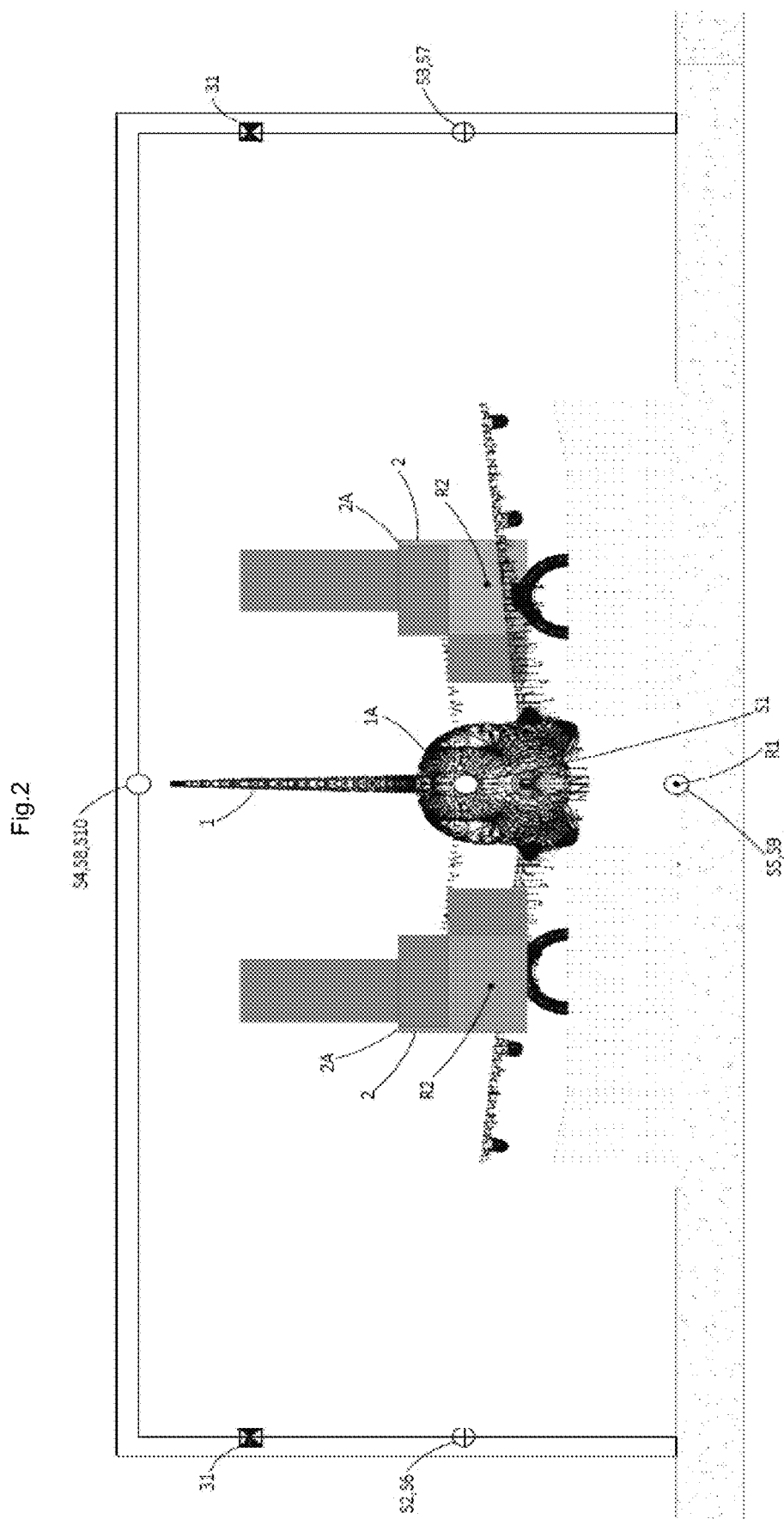
FIG. 2 shows a front view of a cloud of points (1A) representing a HTV (1), for example an aircraft, in a building (4), the reference point R1, two work platforms (2) on each longitudinal side of the HTV at different positions and the reference targets (S1, S2, S3, S4, S5, S6, S7, S8, S9, S10).
Figure 3:
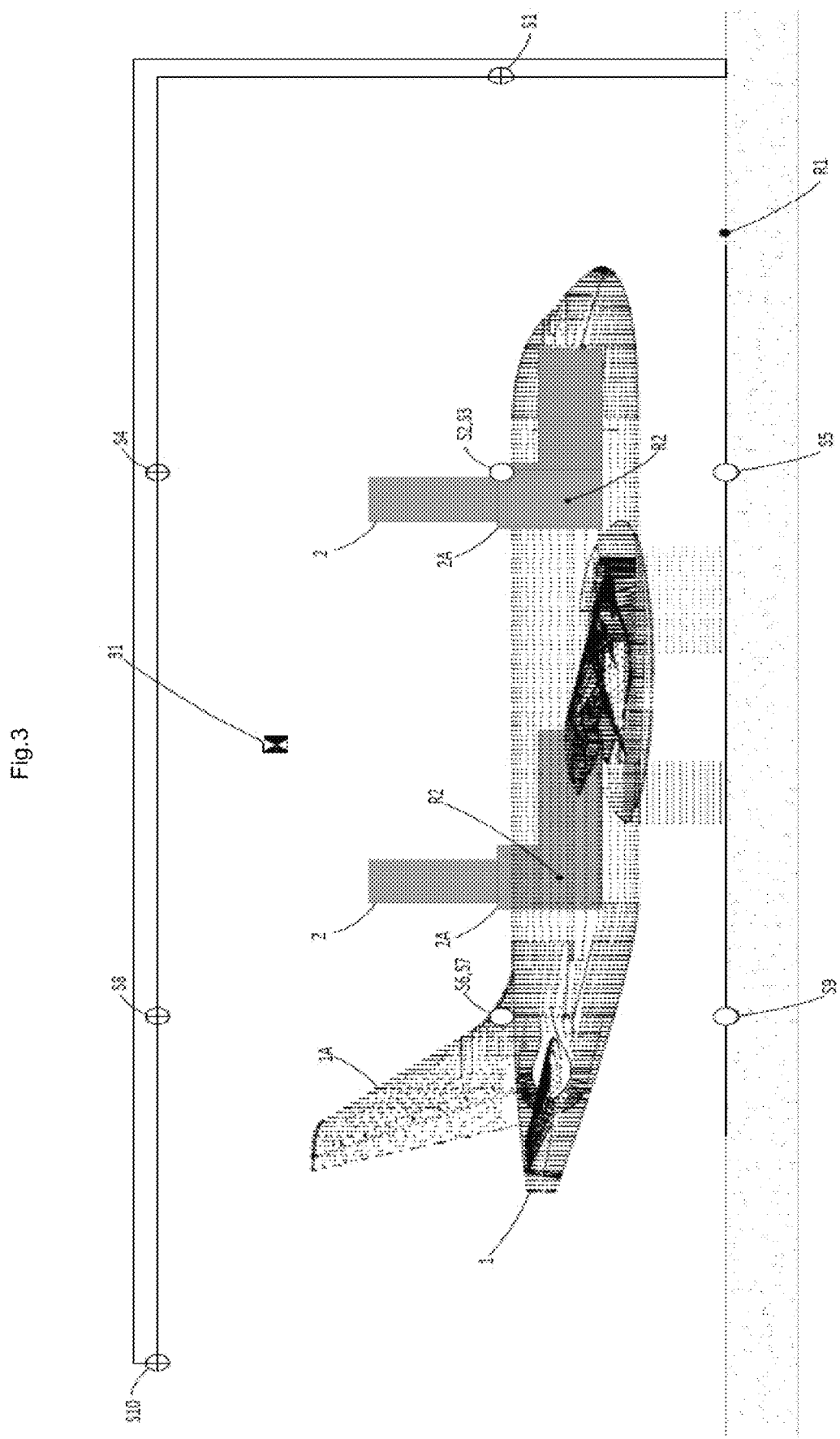
FIG. 3 shows a side view of a cloud of points (1A) representing a HTV (1), for example an aircraft, in a building (4), the reference point R1, two work platforms (2) at different positions and the reference targets (S1, S2, S3, S4, S5, S6, S7, S8, S9, S10).

Referring to FIG. 1, FIG. 2 and FIG. 3, the positioning and collision avoidance system of the present invention is typically utilized in determining the outer surface/shape and position of obstacles like a Human Transportation Vehicle (HTV) (1), in particular an aircraft, within a dedicated area of a building (4), such as a painting and maintenance hangar for determining and setting software limits on the motion of at least one Movable Work Platform (MWP) (2), and for controlling the MWPs (2) for collision avoidance.

Figure 7:
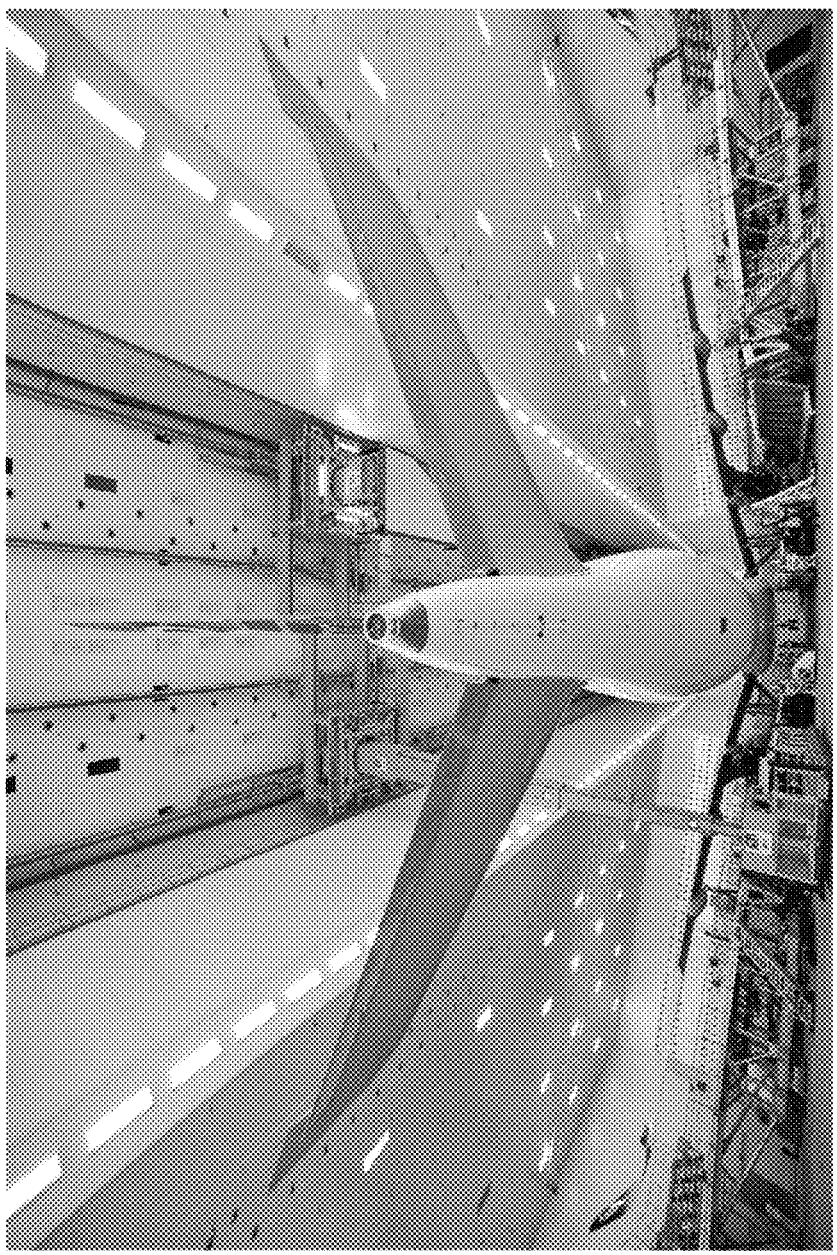
FIG. 7 is a photograph showing a HTV, for example an aircraft, in a building and one movable work platform at a different height on each longitudinal side of the HTV.
Figure 9:
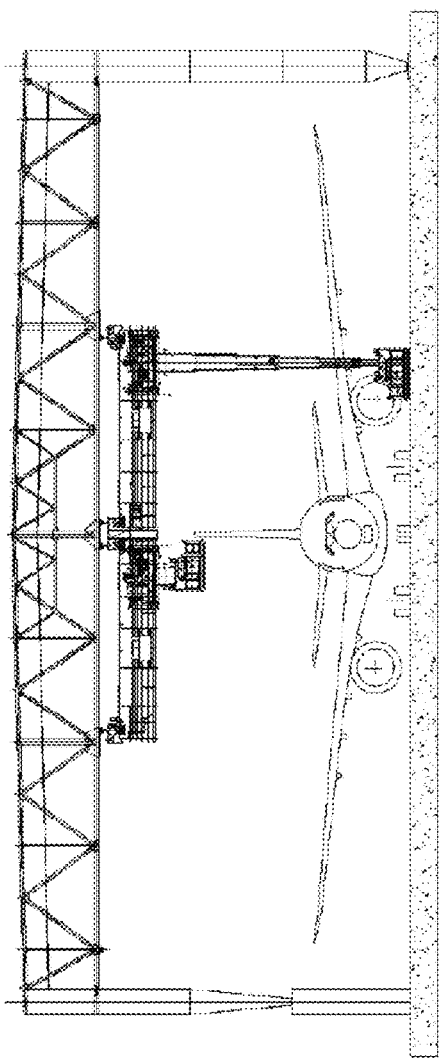
FIG. 9 shows a classical building (4) shape design.
Figure 10:
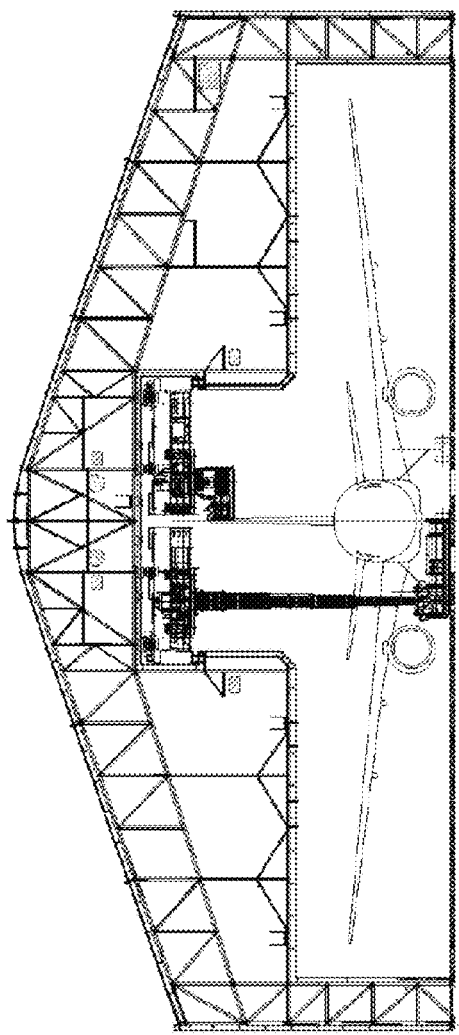
FIG. 10 shows an optimized building (4) shape design for an aircraft.

Referring to FIG. 7, FIG. 9 and FIG. 10, the system will typically operate in a building (4) such as a painting and/or maintenance hangar for aircrafts, where the typical overall building (4) size for parking one unique aircraft is about 80 m-90 m long, 70 m-80 m wide and 30 m-35 m height. Building (4) shape design can be classical (see FIG. 9) or optimized for aircraft painting (see FIG. 10).

FIG. 7 shows an aircraft (1) in a building and one movable work platform (2) on each side of the aircraft (1).

The building (4) is equipped with MWP (2) wherein MWPs (2) are either building-roof suspended work platforms or ground anchored work platforms or floor based mobile work platforms or a combination of building-roof suspended work platforms, ground anchored work platforms and floor based mobile work platforms.

Figure 4:
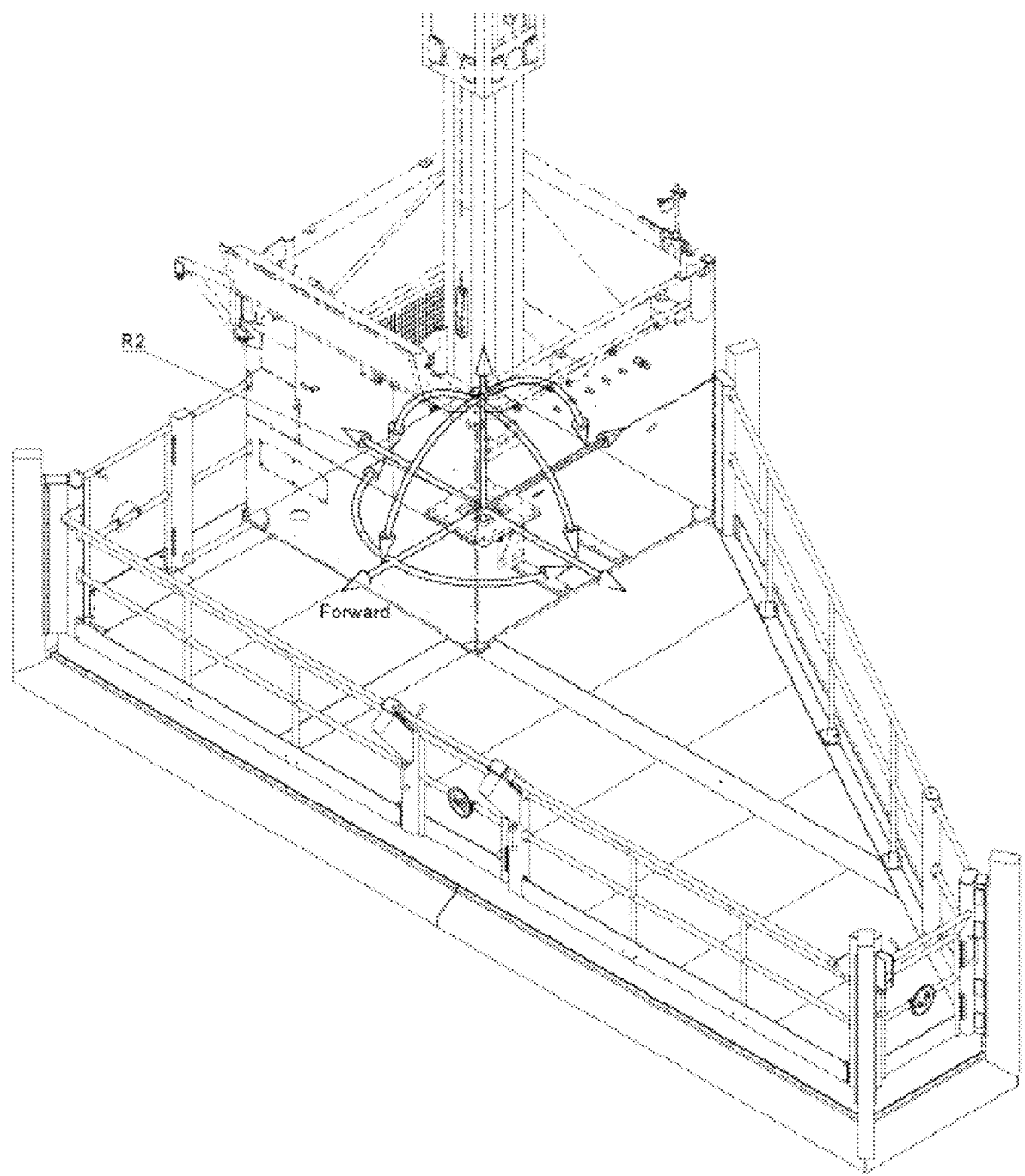
FIG. 4 shows the location of the reference point R2 at the intersection between the movable work platform floor and the vertical axis of the vertical telescopic arm and it shows also the degrees of freedom (6DoF) system on a building-roof suspended movable work platform (2).
Figure 5:
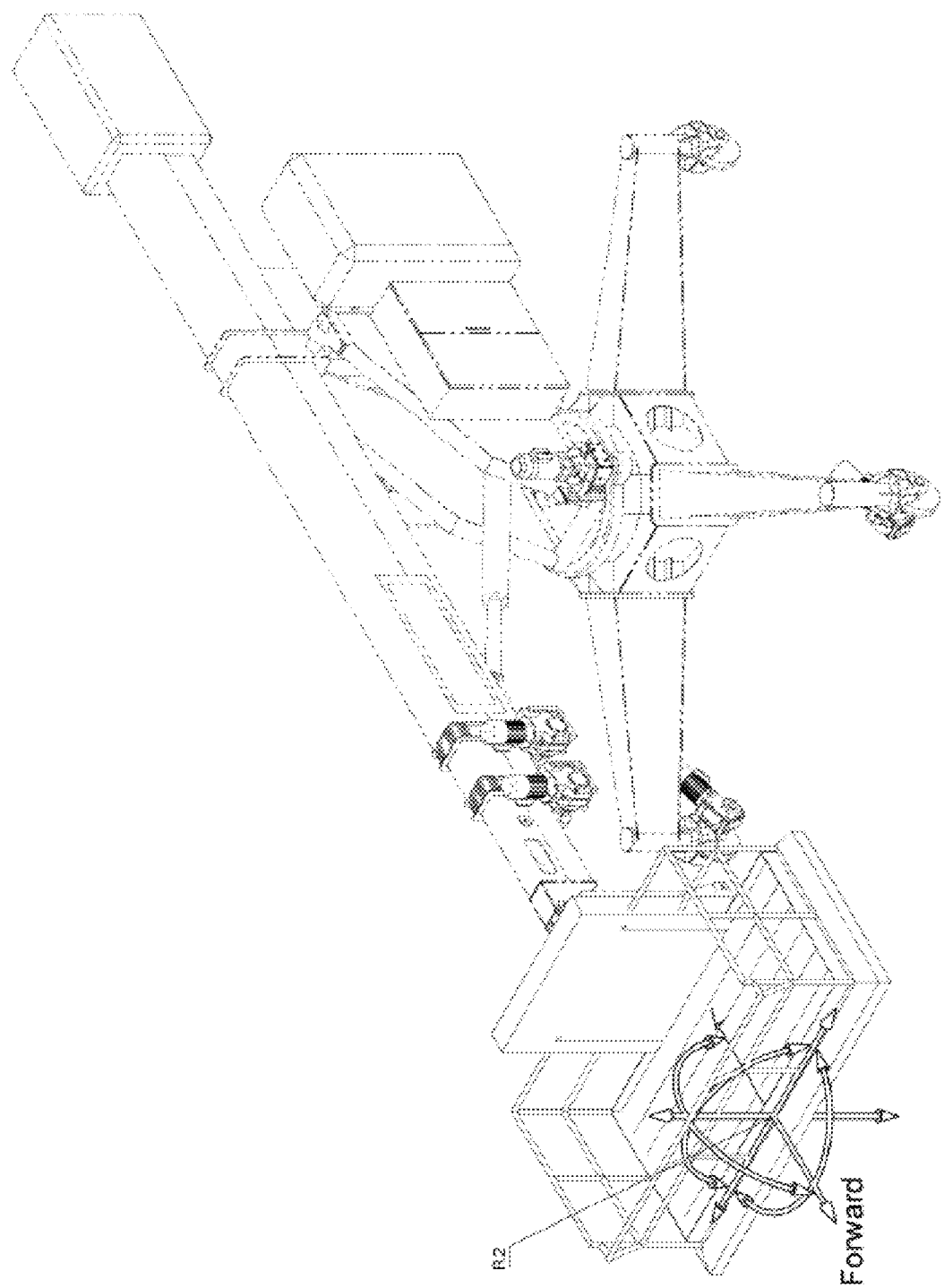
FIG. 5 shows the location of the reference point R2 on a ground anchored movable work platform (2) and degrees of freedom (6DoF) system.
Figure 6A:
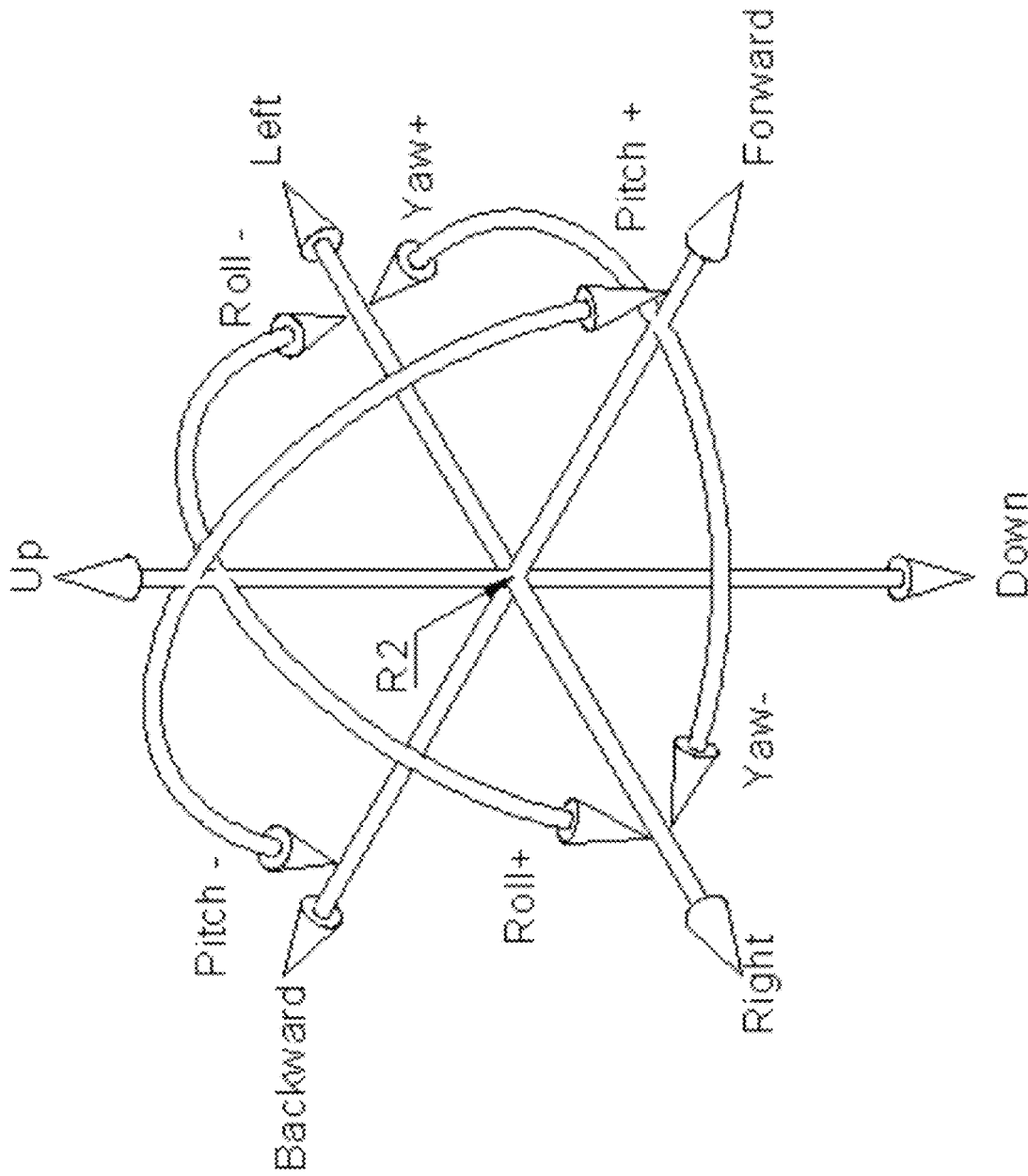
FIG. 6A is a schematic view of the six degrees of freedom coordinate system relative to R2.

FIG. 4 and FIG. 5 show typical MWPs, either building-roof suspended (FIG. 4) or ground anchored (FIG. 5).

A MWP (2) is typically carrying operators to access different points close around the HTV (1), for inspection or other working purposes. It may also be equipped instead carrying operators or in combination with operators with specific devices comprising printing apparatus or camera or robot or surface treatment apparatus.

A MWP (2) is typically manually controlled by operators, but may also be fully or partially automated.

The MWP (2) may be able to move in up to six degrees of freedom.

The building (4) is preferably equipped with two, four or six MWPs (2), where the half of the MWPs (2) are preferably running along the left hand side of the HTV (1), and the other half on the other side of the HTV (1).

At least one HTV (1) is parked into the building (4), wherein the HTV (1) can be an aircraft, a rocket, a space shuttle, a space launch vehicle, a train, a car, a bus or a ship, or other, or a part of the previously mentioned HTVs (1).

Within the building (4) other application dedicated equipment may be installed, fix or movable, related to the building (4) or to the process, typically stairs or ladders or scaffolds or docks or other work platforms, as well as parts of the building structure like walls or columns.

Meaning of outer surface/shape: since it is not common for a HTV (1) to be parked at exactly the same position within the building (4) every time, and since different HTVs (1) will have different attitude/orientation and undergo external shape deformations—in comparison with a theoretical CAD model, due to varying loads aboard the HTV (1), varying shock-absorbing compressions and varying tire pressures, varying equipment and appendices, it is necessary to determine the real outer surface/shape of said HTV (1) as a cloud of points (1A) relative to at least one known building reference point (R1) serving as a central reference point to an absolute origin of a six degrees of freedom system within the space of the building (4) with respect to which the MWPs (2) move. In the same context, the position and orientation up to six degrees of freedom of the HTV (1) is determined.

Preferably, said method has a resolution of cloud of points (1A) of the HTV (1) comprised between 10 mm and 50 mm, where resolution for simple shapes (fuselage of an airplane) may be lower and for more complex shapes (small antennae's) may be higher. Preferably, said method for acquiring and processing a complete cloud of points takes between 60 minutes and 80 minutes.

Figure 11:
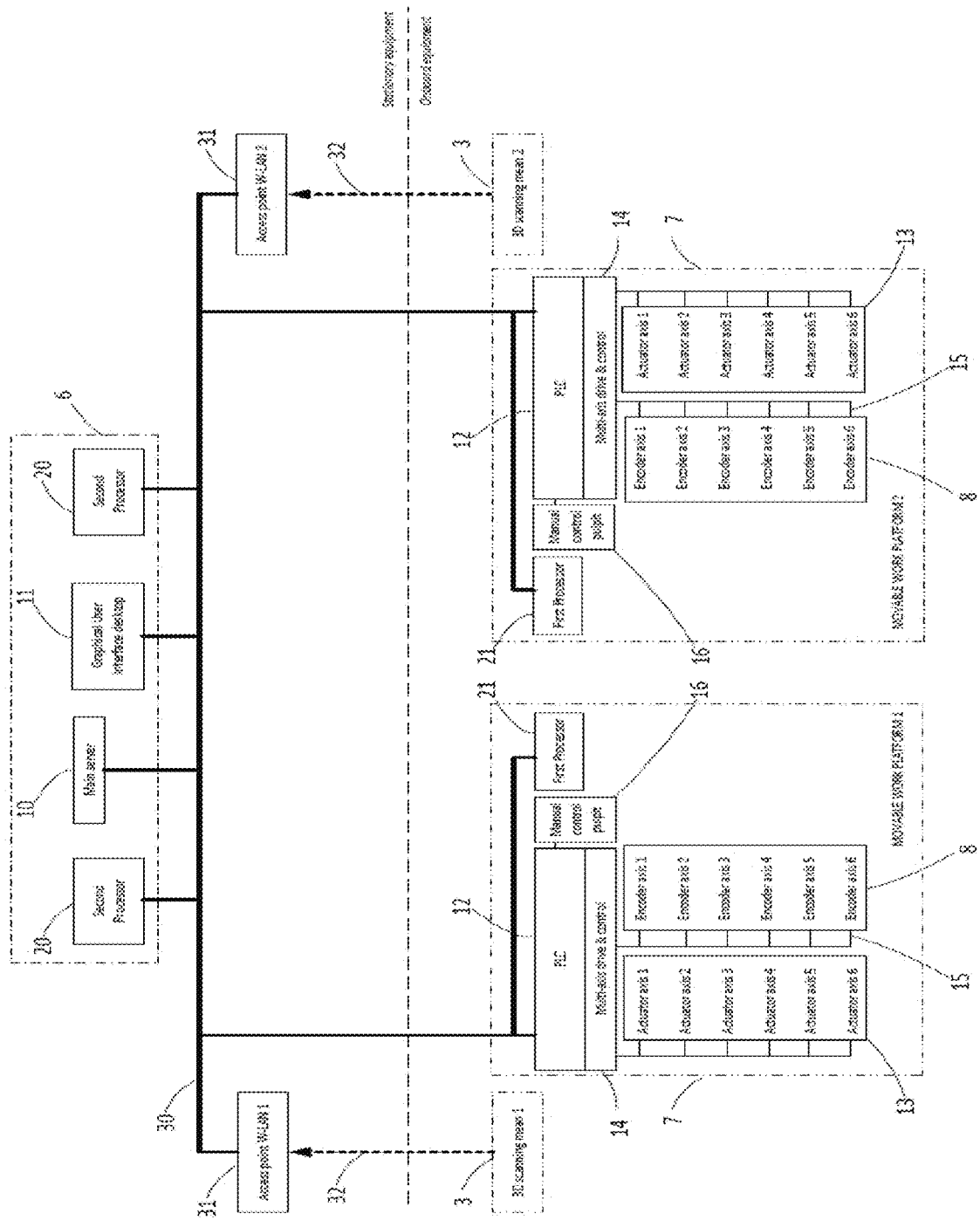
FIG. 11 shows the hardware configuration, the network and interconnected diagram between the equipment constituting the collision avoidance system of the present invention.

A setting means (8) is typically a combination of several devices such as at least one encoder and at least one Programmable Logic Control PLC unit (12), see FIG. 11.

The position of the MWP (2) is determined via setting means (8) to determine a known MWP (2) reference point (R2) with respect to (R1).

For a typical collision avoidance application, a three dimensional model (2A) representative of the MWP (2), its related up to 6 degrees of freedom position and orientation,—referenced to said reference point (R2), is generated, based on the setting means (8).

The three dimensional model (2A) is a combination of simplified forms, including not only the working surface of the movable work platform, but also handrails, fixations, guiding masts and other appendices, and is optimized as close as possible to reality.

The resulting envelope of the three dimensional model (2A) representative of the MWP (2) is extended proportionally to desired safety factors to form virtual safety shells around it. The position of single points of the generated cloud of points (1A) representing the HTV (1) are compared with the position of the three dimensional model (2A). So that when potential risk of collision is detected between the MWP (2) and the HTV (1), a predetermined deceleration curve up to full stop of the MWP (2) is realized to mandatorily respect a predetermined minimum distance to avoid physical contact between any part of the HTV (1) and the MWP (2).

Typical settings are done for ensuring a speed reduction at about 800 mm-1000 mm distance between the MWP (2) and the HTV(1) and full stop by a minimal distance between the MWP (2) and the HTV(1) at about 100 mm to 200 mm.

The direction of the potential risk of collision is determined, so that only motions of the MWP (2) towards the HTV (1) are limited.

Figure 8:
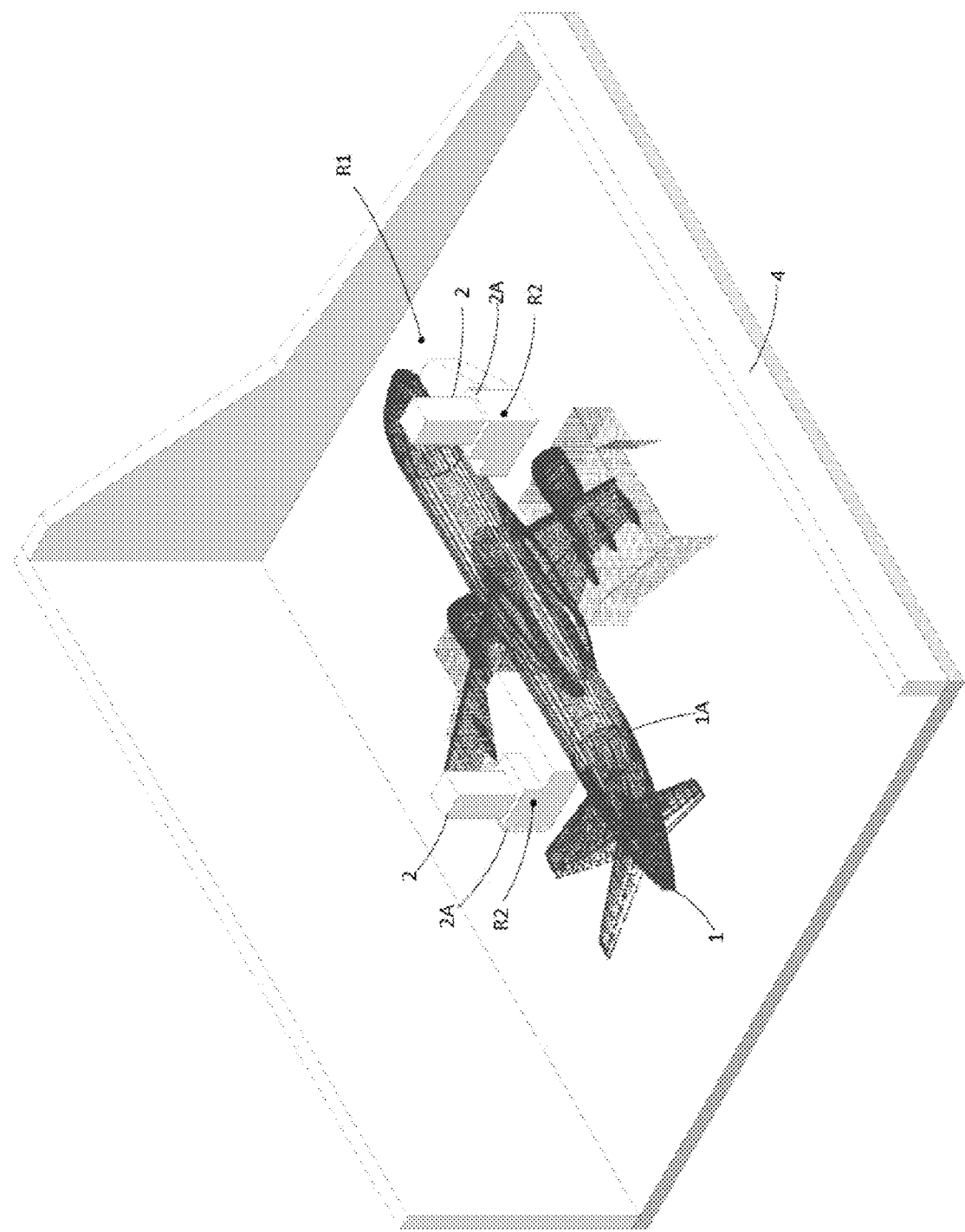
FIG. 8 shows the generated cloud of points (1A) of a HTV (1), for example an aircraft, in a building (4), as well as the generated three dimensional model (2A) of two movable work platforms (2).

FIG. 8 shows the generated cloud of points (1A) of an aircraft (1) in a building as well as the generated three dimensional model (2A) of a movable work platform (2).

Since the cloud of points (1A) may include other points than only the HTV (1) and related to other items situated inside the building (4) and being situated within the working range of the movable work platform, the collision avoidance application may be extended and applied to that other items too, with the same effects.

Since the different MWPs (2) may share the same working area, the collision avoidance application may be extended to a collision avoidance between MWPs (2).

The present invention relates also to the use of the apparatus to automate currently manually controlled motions of said MWP (2) along the HTV (1) based on pre-programmed trajectories.

The terminology used for describing the coordinate system, according to which the real outer surface/shape and position/orientation of the HTV (1) is determined and relative to which the MWP (2) move, is set forth below.

Referring to FIG. 1, FIG. 2, FIG. 3 and FIG. 6*a*, the one known building absolute reference point (R1) is a pre-determined point situated within the building (4) and is the origin point of a six degrees of freedom coordinate system. The exact position is set once, during the first commissioning, using specific metrology device like a laser tracker, and may be slightly different from building to building. This point is defined as the common reference point for all systems. To determine the X, Y and Z orientation, following convention is admitted: the HTV (1) entry orientation within the building (4) gives the orientation of the X axis. The Cartesian right hand rule is used for determining the other axis and rotations, where X-axis is the principal horizontal direction, Y-axis orthogonal to X-axis, and Z-axis right orthogonal to the XY plane.

Referring to FIG. 4, FIG. 5 and FIG. 6B, the MWP (2) relative reference point R2 is a pre-determined point belonging to the MWP (2), and identical for each type of MWP (2). R2 may be the center of mass or another arbitrary point, and defined once using CAD. R2 is the origin of a six degrees of freedom (6DoF) system referring to the freedom of movement of the MWP (2) in three-dimensional space. The MWP (2) is free to change position in translation in three perpendicular axes as forward/backward, up/down, left/right and change in orientation through positive or negative rotation around the three perpendicular axes, termed roll, pitch, and yaw. Preferably the operator is steering the MWP (2) relatively to R2.

For determining the outer surface of the HTV (1) at least one three dimensional scanning mean (3) is used. A three-dimensional scanning mean (3) is typically a LiDAR based technology using all around pulsed laser light to measure distances to the target by illuminating that target and measuring the reflected pulses with a sensor so that differences in laser return times and wavelengths can be used to make digital 3D-representations of the target, as a cloud of points. This high performance laser scanner is preferably transportable, embedded calibrated inclinometer and has preferably wireless LAN communication facilities, autonomous battery system and real time registration technology, such as the commercially available Faro Focus S70 scanner.

The three-dimensional scanning means (3) refers to at least two building reference targets (S1, S2), themselves referring to the at least one known building reference point (R1). Preferably these specific building reference targets (S1, S2, etc.) are calibrated and placed once at first commissioning at a non-moving structure part, or on the floor, using a specific metrology device like a laser tracker.

The three-dimensional scanning means (3) will be programmed to first locate these building reference targets (S1, S2, S3, etc.) before starting each scan process and generate a cloud of points (1A).

The positioning and collision avoidance system of the present invention may integrate a plurality of MWP (2) and scanning means (3). The amount and type of MWPs (2) depends on the configuration of the building (4). The amount of scanning means (3) is determined by the maximum duration time allowed for the scanning operations. Scanning process may be done in a parallel way while using several scanning means (3). Typically, the use of two scanning means (3) will reduce the scanning operation time by two.

Hardware Configuration:

Referring now to FIG. 11 which illustrates the hardware configuration, the network and interconnected diagram between the different equipment components constituting the position determining and collision avoidance system for a system based on two MWPs (2) and two scanning means (3). For more convenience the MWP 1 (2) is associated to the 3D scanning mean 1 (3) and will operate in the left hand side of the center line of the building (4), and the MWP 2 (2) is associated to the 3D scanning mean 2 (3) and will operate in the right hand side of the center line of the building (4).

The system is composed by three main sub-systems. The three-dimensional scanning means (3), the stationary calculation means (6) and the movable work platform control equipment (7).

The term communication means corresponds to an equipment that communicates and exchanges data over Ethernet based LAN (30) or WLAN (31, 32) interfaces.

LAN/WLAN (30,31,32):

To ensure an Ethernet wireless LAN facility (32) between the three-dimensional scanning means (3) and the other equipment, the building (4) is equipped with Ethernet wireless LAN access points (31) fixed on the building (4) structure, preferably at each side of the building (4)—seen from the centerline of the building (4)—for optimized performances. Depending on the building (4) configuration, the number and position of the access points (31) may vary. All Ethernet wireless LAN access points are connected on the Ethernet LAN network (30). All equipment related to the positioning and collision avoidance system and connected to the Ethernet LAN network share the same IP range and subnet, and should be preferably segregated from foreign networks or IP partners to avoid interferences.

The Three-dimensional Scanning Means (3):

The three-dimensional scanning means (3) have preferably wireless LAN communication facilities and are configured within the LAN domain for an automatic reconnection to the Wireless LAN network.

Stationary Calculator Means (6):

The stationary calculator means (6) comprises one first dedicated processor (21) for 3D Data processing (20) per three-dimensional scanning mean (3). The stationary calculator means (6) comprises also one main server (10) which serves as main database for the clouds of points and acts also as interface gateway to the movable work platform control equipment (7). The Graphical User Interface desktop (11) is typically an interactive screen specially developed for serving as human machine interface.

Movable Work Platform Control Equipment (2):

Each MWP (2) comprises onboard control equipment including a Programmable Logic Controller PLC unit (12), preferably failsafe type, such as a Siemens Simatic S7-3xx-F. Each actuator axis (13) of the MWP (2) is independently controlled by the PLC based multi-axis drive and control unit (14). For the actuator axis (13), all kind of actuators are compatible, and inverter drives or controllable proportional valves are preferred for smoother control, but the system would work also if axes are driven directly over motor starters. The current position of each axis constituting the MWP (2) is determined using a set of absolute setting means (8) linked directly to the PLC unit (12) over industrial bus like Profibus or Profinet (15), and referenced according the method described hereunder. The on-board PLC unit (12) is linked to an onboard manual control pulpit (16), where a human operator generates motion set points, typically over joysticks or push buttons, when the MWP (2) is manually controlled. The manual control pulpit (16) orientation is according to R2, heading to X+ of R2, and is built in a fix way so that its orientation cannot be changed. The on-board control equipment comprises also a first dedicated processor (21).

Method for Referencing Setting Means (8):

It is now necessary to describe the method for referencing the setting means (8) used to determine the position and orientation of the MWP (2) having for origin R2. The setting means (8) are all referenced once at initial commissioning, to pre-defined values, with or without offset values, at pre-determined positions, and according to R1. The method uses a set of flags, typically arrows for more precision, placed and fixed carefully on the running structure or on the MWP (2) itself, and according CAD models generated at conception of the MWP (2). Where necessary, the same specific metrology device like that one used for fixing R1 may be also used to fix the definitive positions of that flags. For these setting means (8), the following plausibility and integrity checks are integrated and cyclically verified by the on board PLC unit (12). These checks are: correct rotation/displacement direction relative to the motion direction; rotation/displacement position value changes without active motion; rotation/displacement position value not changing while active motion; speed plausibility between motion set point and encoder speed; plausibility control by checking the encoder value with a pre-determined value at a check position, triggered by the activation of a plausibility sensor passing a flag placed at a statistically often passed path section This method allows determining the position and orientation of (R2) related to the coordinates systems having for origin (R1).

Figure 12B:
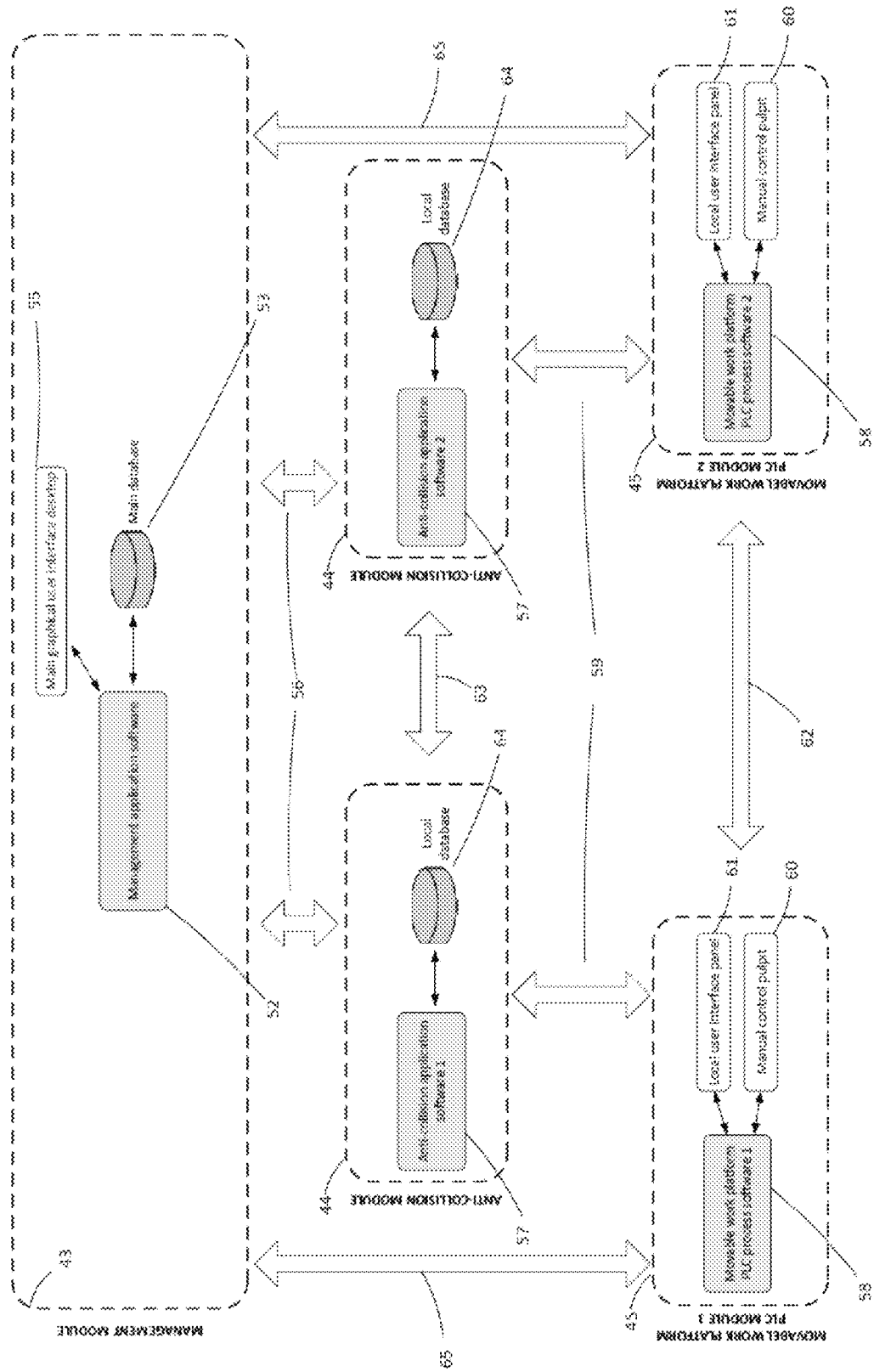
FIG. 12 shows the data flow diagram between the equipment constituting the collision avoidance system of the present invention.

Functions & Database & Data Exchange & Input/Process/Output:

FIG. 12 illustrates the data flow diagram linking the different modules used during the different phases of operation.

From the operational point of view, the method is based on two main operational phases where the first phase corresponds to the collection of points and the generation of one unique cloud of points (1A) and the second phase corresponds to the collision avoidance during utilization of the MWP (2).

The first phase of operation consists in the use of following modules. One first module named 3D scanning module (40) is responsible for collecting partial cloud of points (41) corresponding each to a partial section of the HTV (1). The number of 3D scanning modules (40) corresponds to the number of 3D scanning means (3) used by the system. Each partial cloud of point (41) is sent to another module named 3D module (42). The 3D module (42) is responsible for collecting, filtering and mapping together the partial clouds of points (41) and to create one unique full cloud (1A) representing the outer surface of the complete HTV (1). The generated full cloud of points (1A) is sent to a next module named management module (43).

The second phase of operation consists in the use of following modules. The management module (43) serves as central management system to store the resulting full cloud (1A) generated during phase 1, and to dispatch the full cloud (1A) to the further anti-collision modules (44). The management module (43) serves also as main user interface for operators. This management module (43) stores also all the static parameters qualifying the building (4) characteristics, the MWP (2) settings, the HTV (1) characteristics, and all other characteristics required to define the limits of the system in general. The anti-collision module (44) first combines the settings of the MWP (2) received from the management module (43) and the current position of the MWP (2) received from the movable work platform PLC module (45), to build a three dimensional model (2A) representative of the MWP (2) and its current position and orientation. By comparison between the correctly positioned and oriented three dimensional model (2A) and each point of the full cloud of points (1A) received from the management module (43), the anti-collision module (44) generates permissions of motion to the movable work platform PLC module (45). The number of anti-collision modules (44) corresponds to the number of MWPs (2). The movable work platform PLC module (45) determines the current position and orientation of the MWP (2) based on the setting means (8) and method previously described, and sends the information to the anti-collision module (44), and limits the motion of the MWP (2) based on the permissions of motion received from the anti-collision module (44).

More specifically, each module is composed by a specific software.

3D Scanning Means Embedded Software:

The 3D scanning module (40) is composed by an embedded software (46) belonging to the 3D scanning mean (3). It is up to this embedded software (46) to achieve each scan and to generate the partial clouds of points (41). Scan requests are based on triggers and parameters sent over a dedicated data interface (48) by the 3D application software (47) belonging to the 3D module (42). Each partial cloud of points (41), each corresponding to a partial section of the HTV (1), contains the at least two building reference targets (S1, S2), recognized automatically by the embedded software (41). Typical parameters sent by the 3D application software (47) over the data interface (48) are the required resolution settings and the required quality settings, as most of the 3D scanning means (3) are capable of multi resolution levels with different quality levels. The resolution setting determines the relative distance between the points in the cloud of points and the corresponding level of detail. By increasing the resolution setting, the number of points captured increases and the relative point distance decreases. By decreasing the resolution setting, the number of points captured decreases and the relative point distance increases. The resolution setting is based on the level of detail required, the distance to the HTV (1), and the distance to the building reference targets (S1, S2,). The quality setting determines the rate of measurement and the level of noise reduction. By increasing the quality setting, the rate of measurement decreases. The amount of time the scanner captures each scan point, as also the statistical measuring precision of each point, increases, by taking multiple measurements to confirm the information by averaging the result. Noise reduction is done by an internal algorithm used to determine whether differences in scan points are an accurate representation of detail or noise. The algorithm compares scan points within a specific distance of one another and determines if the difference is within the tolerance specified by the quality setting. If it is not, then the scan point is removed. Basically quality setting is chosen based on environmental conditions, keeping in mind that best quality takes more time to scan and a lower quality increases error tolerances.

Interface 3D Scanning Module/3D Module:

Over the same data interface (48), the 3D scanning means (3) sends instantly back to the 3D application software (47) its own current status of operation. Once a partial cloud of points (41) has been fully processed, the 3D scanning mean (3) compiles each scanning data into a specific file, and sends it over the dedicated data interface (48) to the 3D application software (47).

3D Application Software:

The 3D application software (47) runs either on a dedicated physical computer or on a virtual machine running on the main server (10). The 3D application software (47) collects and stores in a local database (49) all specific files related to partial cloud of points (41). The next step is the automatic registering and post-processing. The 3D application software (47) is an own development which manages extra functions called from a 3D specialized software (50) available on the market, like Faroscene from Faro, or Polyworks from InnovMetric Software Inc., and interfaces with it over a dedicated SDK (Software Development Kit).

During the mapping of all partial clouds together, the main aspect is the use and respect of the building reference targets (S1, S2, etc.) located in each partial cloud of points (41) for a very accurate mapping first, and second for the translation of all points constituting the full cloud of point (1A), according the building reference targets (S1, S2, etc.), and therefore to R1.

Additional extra features are applied on the 3D application software (47), depending on the configuration of the building (4) and its content.

The first extra feature of the 3D application software (47) excludes data, unusable for the collision avoidance system, in order to limit the size of the files to be handled and therefore the post processing time. In fact, even if the 3D scanning mean (3) is able upon its maximum scanning range to scan the complete building (4) and any details of it, like walls, roof, floor, and other static obstacles, only data in a limited range defined by the maximum working range of the MWPs(2) in the building (4) are to be considered. A set of parameters defines the scanning operating range. This means the HTV (1) is scanned and, if appropriately parametrized, other elements of the building (4) and any details of it, like walls, roof, floor, and other static obstacles within the maximum range of the MWP (2) are scanned additionally.

Another additional feature limits post processing time. The method consists in acquiring the points in two stages, where all static points, like walls or other fix obstacles are scanned, post processed and stored once during first stage. The second stage corresponds to a systematic scan, within the frame of the first scan, to acquire points corresponding to non-static points, like for the HTV (1). Therefore the systematic post-processing is limited to the second stage only. Resulting points of first and second stage are finally merged together.

Another feature is used to create, where necessary and depending on the configuration of the building (4) and depending on the requirements of the collision avoidance system, a virtual wall of points. The creation of the virtual wall of points is done by the 3D application software based on criteria contained in a set of parameters defined during commissioning.

The result of all filtering algorithm and mapping of partial cloud of points together is one merged unique full cloud of points (1A), which is systematically associated to the parameter qualifying the HTV (1), and stored as a specific file into a local database (49) belonging to the 3D application software (47). The associated file is used by the 3D application software (47) to check by comparison of cloud of points between the newly scanned HTV (1) and the same type of HTV (1) data stored previously, and is giving, as a statistic information, a percentage of similarity between both.

Additionally each full cloud of point (1A) is transformed by the 3D specialized software (50) into a single-surface triangulated mesh, and an ".stl" format file is generated and stored into the same local database.

A dedicated local graphical user interface (51) allows an operator, over the specialized 3D software (50), the access to the data stored in the local database (49), especially the partial and full cloud of points (41, 1A). This user interface is mainly used in case of necessity, to check specific details, but has no operational functionality.

Management Application Software:

The management application software (52) is an own development and is to be considered as the master software of the whole system. It runs on the one main server (10) previously described. The aim of the management application software (52) is to coordinate both operational phases, by managing the first phase of operation and dispatching the results coming from the first phase to the second operational phase.

The management application software (52) stores into its dedicated database (53) all the static parameters qualifying the building (4) characteristics, the MWP (2) settings, the HTV (1) characteristics, and all other characteristics to define the limits of the system in general. The location of the scanning positions is determinant for limiting the number and surface of shadows corresponding to surfaces not or badly visible, especially on complex or large sized HTVs (1). Therefore based on the characteristics of each type of HTV (1), the optimal location of the scanning positions and optimal resolution will differ and will be separately stored into the database.

For accomplishing phase 1, the complete set of parameters as determined above is systematically transmitted with the scanning request from the management application software (52) to the 3D application software (47) over a dedicated data interface (54). In return, and over the same data interface, the resulting unique full cloud of points (1A) is automatically exported from the 3D application software database (49) to the management application software database (53).

One main graphical user interface application (55) is running on the Graphical User Interface desktop (11). The main graphical user interface application (55) is composed by several menus with different access levels, and is password protected. From this central point any setting can be checked or modified, status and performance indicators of the whole system can be consulted.

A specially designed real-time 3D animation view of the relevant static and complete mobile contents of building (4) can be visualized on the user interface (55), showing real-time positions and orientations of building (4) components, HTV(1) and MWPs (2) during the operation.

Interface Management Application Software/Anti-collision Application Software:

Over a dedicated data interface (56), the management application software (52) shares the resulting full cloud of points (1A) with the anti-collision application software (57) and in the meantime also the MWP (2) settings. Transferred data is stored in the local database (64) belonging to the anti-collision application software (57).

Anti-collision Application Software/Movable Work Platform PLC Process Software:

The anti-collision application software (57) is an own development for managing collision avoidance. The anti-collision application software (57) runs on each onboard first processor (21) of each MWP (2).

Figure 13A:
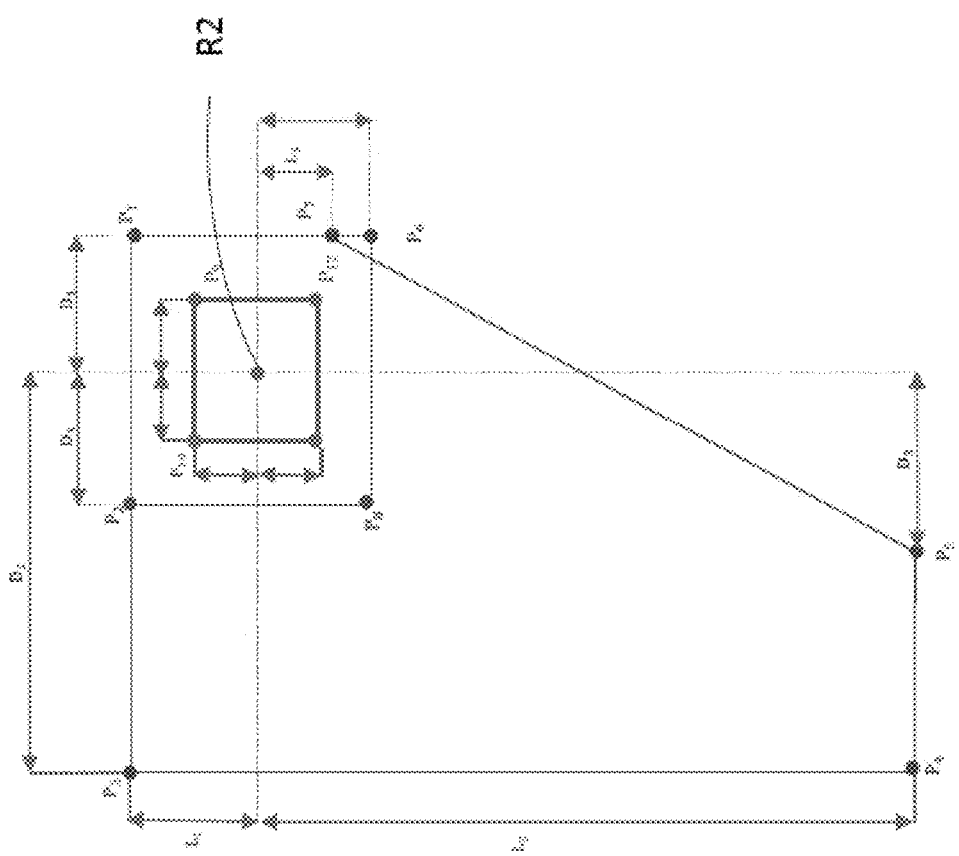
FIG. 13A shows a top view of main parameters for defining a simplified virtual three dimensional model (2A) on a building-roof suspended work platform.
Figure 13B:
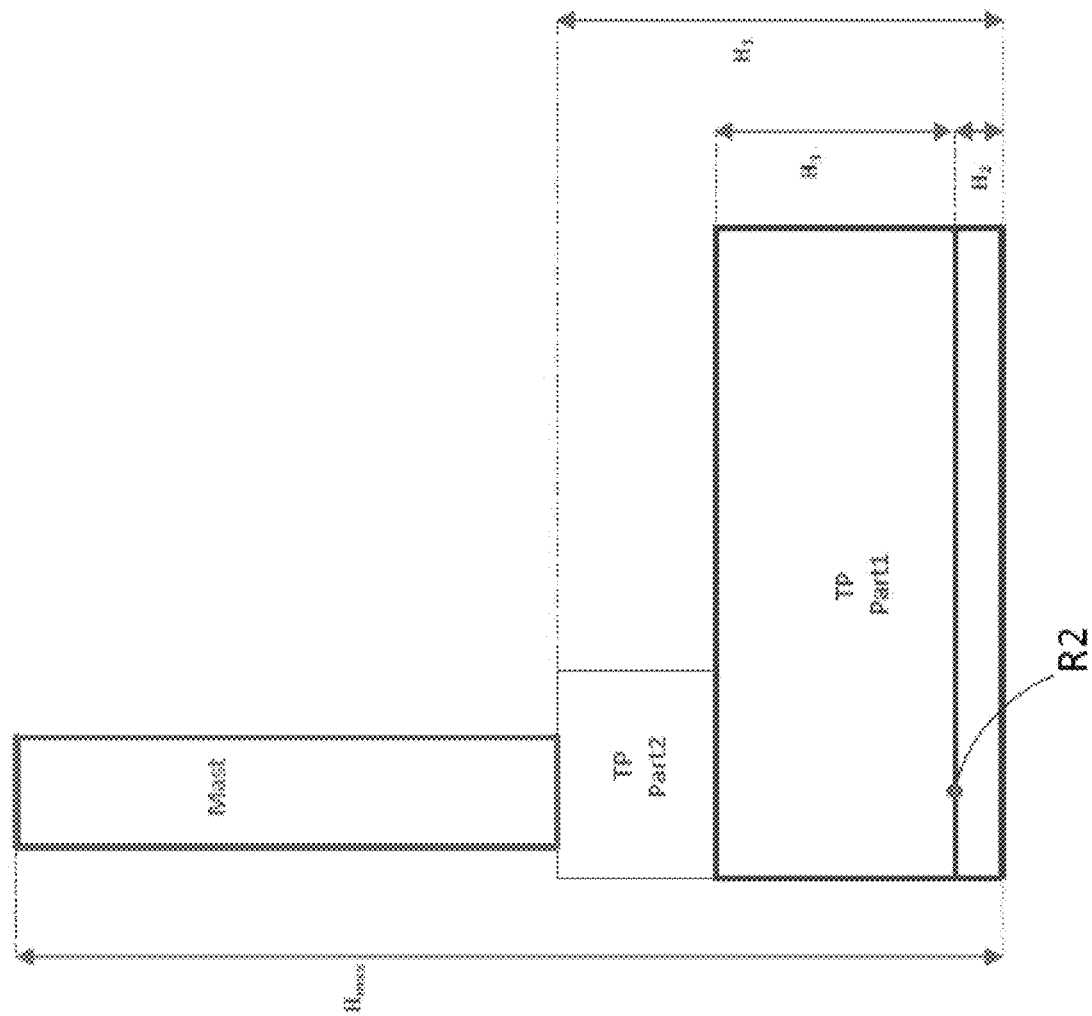
FIG. 13B shows a side view of main parameters for defining a simplified virtual three dimensional model (2A) on a building-roof suspended work platform.
Figure 14B:
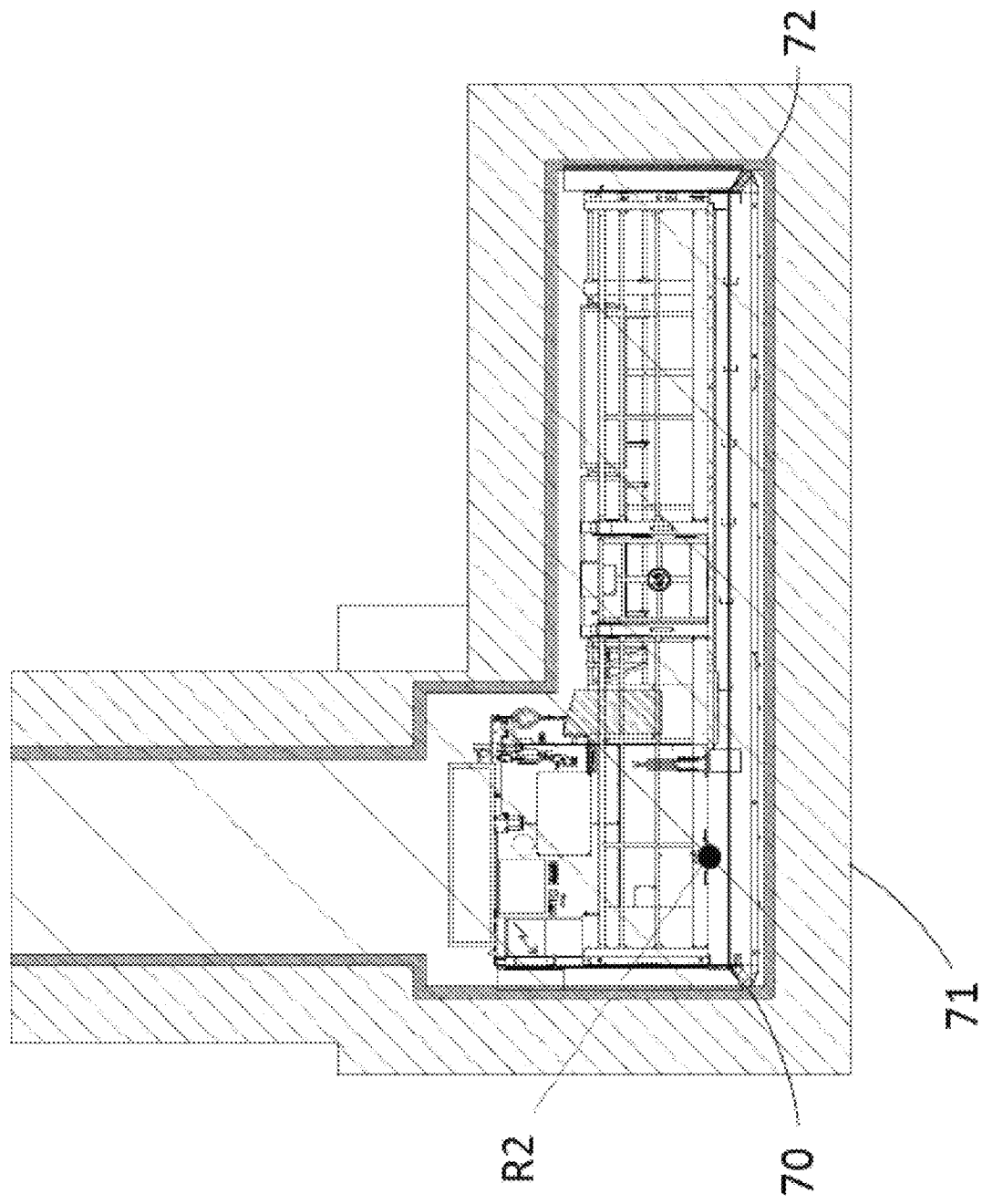
FIG. 14B shows a front view of virtual core (70) and safety shells (71, 72) representative of a building-roof suspended movable work platform (2) and of R2.
Figure 14C:
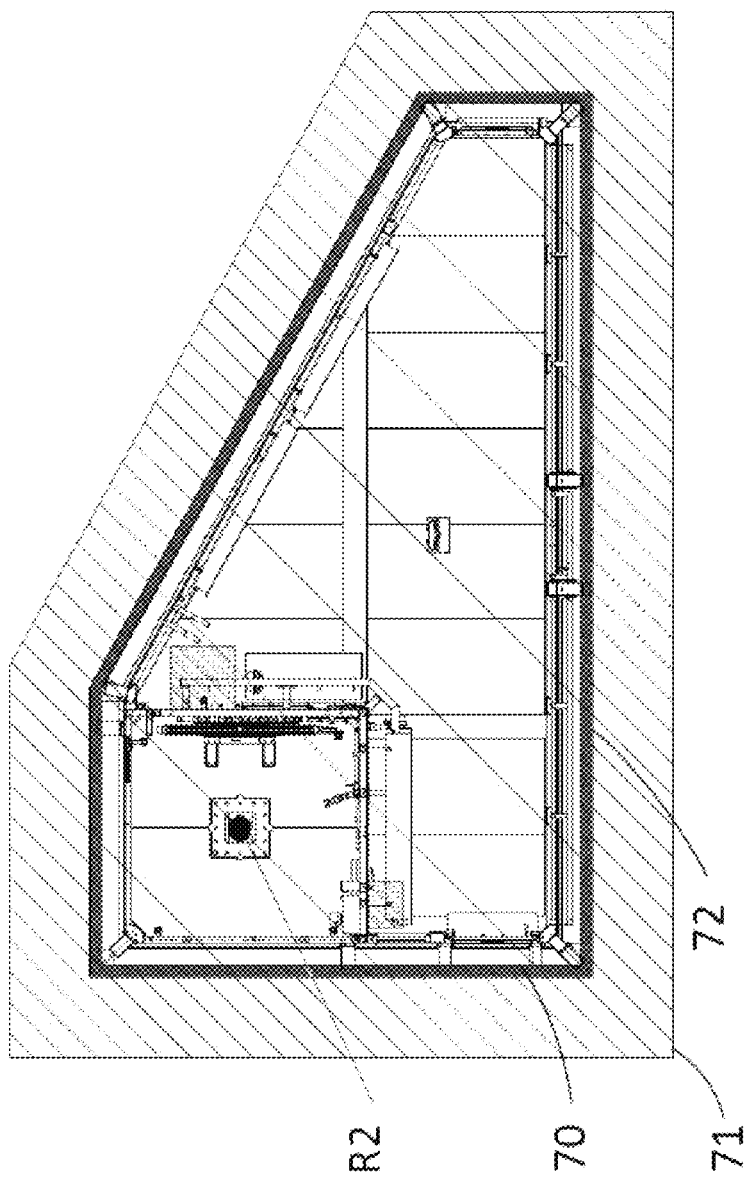
FIG. 14C shows a top view of virtual core (70) and safety shells (71, 72) representative of a building-roof suspended movable work platform (2) and of R2.

Referring now to FIG. 14D, the preliminary task for the anti-collision application software (57) is to build a simplified virtual three dimensional model (2A) as a virtual core shell representative of the MWP (2) and based on the set of parameters defining and including the MWP (2) physical boundaries like working surface, handrails, fixations and other appendices, and including its supporting or suspended mast if any, and having all for origin R2. FIG. 13A and FIG. 13B illustrate the principle, applicable for any type of MWP (2). The number of volumes constituting the core shell depends on the complexity of the MWP (2), but has to be kept reasonably low as it influences the main performances of the calculations.

Referring now to FIGS. 14A, 14B, 14C, 14D, another set of parameters is used to extend in all directions the core shell (70) to create virtual safety shells. Typically a first larger safety shell (71) is created and corresponds to an area where only low speed is allowed. A second smaller safety shell (72) is created and corresponds to an area where the motions are stopped.

Back to FIG. 12, the movable work platform PLC process software (58) is an own development for controlling, based on set points fixed over a manual control pulpit (60) actuated by operators, the motions of the axis constituting the MWP (2), and to determine instantly, using the set of setting means (8) described above, the six degrees of freedom position and orientation of the MWP (2), having for origin R2 and related to the coordinates systems having for origin R1 over the method of referencing described previously.

The current six degrees of freedom position and orientation of the MWP (2) is determined and shared instantly with the anti-collision application software (57) over a very fast and reliable dedicated data interface (59).

Based on the current six degrees of freedom position and orientation of the MWP (2) received over that data interface (59), the anti-collision application software (57) translates and orientates the virtual three dimensional models (2A)—core shell (70) and safety shells (71, 72)—related to the coordinates systems having for origin R1.

A dedicated algorithm of the anti-collision application software (57) compares the position of each single point of the generated full cloud of points (1A) representing the HTV (1), having for origin R1 with a set of surrounding investigation zones around MWP (2), defined by the translated and orientated virtual three dimensional model (2A), having for origin R1. As a result of this comparison, the anti-collision application software (57) determines, according to R2, the direction(s) of potential risk of collision.

So that when a potential risk of collision is detected between the MWP (2) and the HTV (1), the anti-collision application software (57) sets, according to R2, a set of permissions for high speed, resp. motion enabled, accordingly safety shells settings and combined with information regarding motion directions. Information are shared instantly with the movable work platform PLC process (58) over the very fast and reliable dedicated data interface (59).

The movable work platform PLC process (58) combines set points of motion, fixed over the manual control pulpit (60), actuated by operators, with received permissions from anti-collision application software (57) for enabling/disabling high speed, motion, and direction, to limit motions of each axis accordingly, and according to R2, realizing the function of collision avoidance between the MWP (2) and the HTV (1).

As defined above, the full cloud of points (1A) may integrate also parts from the building (4) and any details of it, like walls, roof, floor, and other static obstacles what are within the maximum range of the MWP (2). By extension, the function of collision avoidance will be extended to not only the human transportation vehicle but also parts from the building (4) and any details of it.

A local user interface panel (61) shows the operator locally, on the MWP (2), over simple indicating lights whether the collision avoidance system is activated, operational, and if potential collisions are detected, or not.

Over the dedicated data interface (56), the anti-collision application software (57) shares in the meantime instantly the results of its calculations to the Management application software (52), for tracking and tracing purposes. All input and output conditions of the second phase of operation are stored into the main database (53).

As movable work platform PLC process software (58) and all anti-collision application software (57) are linked together over previously described data interfaces (59, 56), and sharing data representing the MWPs (2), related investigation zones and the current six degrees of freedom position and orientation of each movable work platform, the function of collision avoidance is extendable to a collision avoidance system between different MWPs (2), with the same effects as previously described, by comparing together each investigation zones of each MWP (2) and having all for origin R1. For better performances, direct data interfaces (62, 63) between PLC process software (58) and also between anti-collision application software (57) are foreseen.

The system is extendable to fully automate the motions during the operations. With this system, the management application software (52) determines limits, designates and controls dynamically the trajectories of the MWP (2) for automatic motion, and optionally controls a plurality of numerically controlled robotic end effectors mounted on the MWP (2), which may spray and dispense the water, stripping agents, paint and which may perform other operations on the HTV (1). Other enhancement of the system, known as dynamic path planning, includes improved employee health and safety, and reduces production time. A dedicated data interface (65) is used for transmitting motion orders generated by the Management application software (52) to the movable work platform PLC process software (58), and in return for transmitting status signals from the movable work platform PLC process software (58) back to the Management application software (52).

Phases of Operation:

From the operational point of view, the method is based on two main operational phases where the first phase corresponds to the collection of points and the generation of one unique cloud of points (1A) and the second phase corresponds to the collision avoidance during utilization of the MWP (2).

PHASE 1:

The first operational phase is realized by a systematic three-dimensional scanning each time a HTV (1) is brought into the building (4).

As described above, due to the large size and complexity of the outer surface of the HTV (1) and to avoid shadows where measures cannot be taken with sufficient quality, a multiple scan procedure is required, from several pre-defined scanning positions. The management application software (52) stores into its dedicated database (53) for each type of HTV (1) the optimal scanning positions and accordingly the optimal resolution. The scanning positions are defined for combining scans of the HTV (1) from the side, from the top and from the bottom. Note that for the different scanning positions, the operator shall take into account to keep a reasonable safety distance from where the HTV (1) is supposed to be, as the acquiring process has still not been done and the collision avoidance system is not engaged. It is necessary, due to the large size of the HTV (1), to use man-lifts to reach the upper positions. If MWPs (2) provide the lifting function, they can be used to reach the upper positions. In case MWPs (2) are used, they may be manually controlled by operators to reach each scanning position or alternatively pre-programmed to reach each scanning position in an advanced automatic-assisted way. The collection sequence remains the same in both modes.

As described previously, building (4) is preferably equipped with two, four or six MWPs (2), where the half of the MWPs (2) are preferably running along the left hand side of the HTV (1), and the other half on the other side of the HTV (1). The embodiment of the present invention is based on two MWPs (2) and two scanning means (3). For more convenience the MWP (2) is associated to the scanning mean (3) and will operate in the left hand side of the center line of the building (4), and the MWP (2) is associated to the scanning mean (3) and will operate in the right hand side of the center line of the building (4). Scanning process may be done in a parallel way, typically the use of two scanning means (3) will reduce the scanning operation time by two.

The collection sequence is done in an automatic way, coordinated by the management application software (52) as described above.

The HTV (1) is positioned at its definitive location and condition. Other application dedicated movable equipment, typically stairs, ladders, scaffolds, docks or other work platforms, are placed in their definitive location and condition too. An operator drives the MWP (2) to a pre-defined initial position, preferably on floor level, and places carefully the scanning mean (3) at a predetermined position on the MWP (2). In the meantime a second operator does the same operation on MWP (2) with the scanning mean (3). Both scanning means are switched on. After a booting sequence, the operational status of each scanning mean (3) is sent to the management module (43) over the 3D module (42) and related data interfaces.

From the main graphical user interface application (55), an authorized operator is now able to start the procedure of phase 1. Each MWP (2) is driven, either manually controlled or in an advanced automatic-assisted way to the first scanning position. Once the first scanning position reached, the first partial cloud (41) is collected. Once achieved, each MWP (2) is driven to the second scanning position, and so on until the last scanning position has been reached and the last partial cloud (41) is achieved.

Over the main graphical user interface application (55), the completion of operation can be checked, first by auto-detect of missing data, and also visually by inspection of the received 3D data. Additional scanning may be done, or scans redone, as necessary.

Once the full one unique cloud of points (1A) properly done, an operator drives the MWP (2) to initial position, and removes carefully the scanning mean (3). In the meantime a second operator does the same operation on MWP (2) with the scanning mean (3).

Since the positioning and collision avoidance system is based on an optically based hardware—three dimensional scanning means (3)—for determining the cloud of points (1A), and building (4) may be used for painting purposes, the optical hardware is to be preferably installed when the HTV (1) has been just parked and is to be removed after determination of the outer surface/shape of the HTV (1), and before painting or maintenance process are started. This first avoids risks of overspray on the optical lenses of the sensing hardware, and avoids the use of specific hardware suitable for hazardous locations, known also as explosion proof, when paint in use is solvent based. It is to be understood that the method is based on a determination of the position/orientation and outer surface/shape of a HTV (1) at a defined instant, under defined conditions. Modifications of the conditions after the scanning procedure are not taken in consideration by the system. Note that the system may be enhanced for being also suitable during painting or maintenance operations, and would therefore be able to provide instant/real time data during painting or maintenance operations.

PHASE 2:

The second operational phase corresponds to the collision avoidance during utilization of the MWP (2) for productive tasks.

As described above, the one unique full cloud of points (1A) is automatically shared to the movable work platform control equipment (7).

For proof of function, prior to start productive operational movements under the control of the collision avoidance system, the proper function requires to be briefly tested by the operator. This is performed at a virtual test-object, marked as a square on the floor, having a virtual height of one meter. When the collision avoidance system is enabled, the operator approaches the virtual test object with the MWP (2) from different directions and checks if speed reduction and full stop occurs properly, as well as if the backup movement in the opposite direction of the potential collision works correctly. The virtual test-object is a fixed part of the full cloud of points. Several virtual test-objects may be virtually placed at convenient locations inside the building (4) during commissioning of the system and marked accordingly on the floor.

Reaction of the system during phase 2: During the movements of MWP (2) in phase 2 the closed loop platform control equipment (7) is surveying in real time the potential occurrence of a collision between the MWP (2) and the HTV (1). When an intersection between the full cloud of points (1A) and the MWP (2) safety shell (71) is detected, the MWP (2) is only permitted to continue its movement in slow speed and a light is indicating this condition. When an intersection between the full cloud of points (1A) and the MWP (2) safety shell (72) is detected, the MWP (2) is full stopped and a light is indicating this condition. In this case, the operator is only permitted to move in the opposite direction of the potential collision.

From an operational point of view and as mentioned previously, the MWP (2) is typically controlled over a manual control pulpit (16), where a human operator generates motion set points, typically over joysticks or push buttons. The effect of the collision avoidance system is to constrict the axis motion speed to safe values, in the corresponding direction.

Note that the collision avoidance system may be disabled over the main graphical user interface application (55). In this case, the MWP (2) is free to move in its 6DoF, only limited by its own physical freedom of movement.

It is appreciated that certain features of the invention, which are, for clarity, described in the context of separate embodiments, may also be provided in combination in a single embodiment.

Conversely, various features of the invention, which are, for brevity, described in the context of a single embodiment, may also be provided separately or in any suitable subcombination.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

The invention claimed is:

1. An apparatus for generating a cloud of points (1A) representative of a real outer surface of a human transportation vehicle (1) located in a building (4), for determining a position and an orientation of the human transportation vehicle (1) in the building (4) and for determining a relative position and a relative orientation of a movable work platform (2), the position and the orientation of the human transportation vehicle (1) and the relative position and the relative orientation of the movable work platform (2) being referenced with respect to at least one known building reference point (R1), the apparatus for preventing collisions between the movable work platform (2) and the human transportation vehicle (1), the apparatus comprising:

the at least one known building reference point (R1) being an origin point of a 6 degrees of freedom coordinate system and serving as a central common reference point, at least one three-dimensional scanning means (3), referring to at least two building reference targets (S1, S2), each of the at least two building reference targets (S1, S2) referring to the at least one know building reference point (R1), configured to determine a three dimensional representation of the real outer surface of the human transportation vehicle (1) as the cloud of points (1A), at least one stationary calculator means (6) configured to generate the cloud of points (1A) representative of the real outer surface of the human transportation vehicle (1), a first known movable work platform reference point (R2) located on the movable work platform (2), at least one setting means (8) for setting the relative position and the relative orientation of the movable work platform up to 6 degrees of freedom according to the first known movable work platform reference point (R2) with respect to the at least one known building reference point (R1), at least one first processor (21) for generating a three dimensional model (2A) representative of the movable work platform (2), the first processor (21) for determining an up to 6 degrees of freedom position and an up to 6 degrees of freedom orientation of the three dimensional model (2A) representative of the movable work 25 platform (2), the three-dimensional scanning means (3), the setting means (8), the stationary calculator means (6) and the first processor (21) being linked together via a communication means (30, 31, 32), and the first processor (21) configured to compare the up to 6 degrees of freedom position and the up to 6 degrees of freedom orientation of the three dimensional model (2A) with each point in the cloud of points (1A) to prevent collisions between the movable work platform (2) and the human transportation vehicle (1).

2. The apparatus according to claim 1, wherein the at least one three-dimensional scanning means (3) refers to at least two building reference targets (S1, S2, S3, S4, S5, S6, S7, S8, S9, S10), the at least two building reference targets (S1, S2, S3, S4, S5, S6, S7, S8, S9, S10) referring to the at least one known building reference point (R1).

3. The apparatus according to claim 1, comprising one movable work platform (2) on each side of a longitudinal axis of the human transportation vehicle (1).

4. The apparatus according to claim 1, wherein the movable work platform (2) is one of the following: a building-roof suspended work platform, a ground anchored work platform, or a wheeled work platform, or a combination thereof.

5. The apparatus according to claim 4, wherein the movable work platform (2) is automatically or manually controlled.

6. The apparatus according to claim 1, wherein the movable work platform (2) carries one of the following: a printing apparatus, a camera, a robot, a surface treatment apparatus, a human, or a combination thereof.

7. The apparatus according to claim 1, wherein the human transportation vehicle (1) comprises at least a portion of one of the following:

an aircraft, an helicopter, a rocket, a space shuttle, a space launcher, a train, a car, a bus or a ship.

8. The apparatus according to claim 2, further comprising a plurality of calibrated reference targets (S1, S2, S3, S4, S5, S6, S7, S8, S9, S10) located at non movable locations of the building (4) during generation of the cloud of points (1A).

9. The apparatus according to claim 1, wherein the three-dimensional scanning means (3) is carried by the movable work platform (2) during the generation of the cloud of points (1A).

10. The apparatus according to claim 1, wherein the communication means is based on an Ethernet based LAN (30) or WLAN (31, 32) infrastructure.

11. The apparatus according to claim 1, wherein the at least one stationary calculator means (6) comprises at least one main server (10), at least one second processor (20) for three dimensional data processing per three dimensional scanning means (3), the at least one first processor (21) for anti-collision management, at least one Graphical User Interface desktop (11), and the communication means (30, 31, 32) includes an Ethernet infrastructure linking the at least one main server (10), the at least one second processor (20), the at least one first processor (21) for anti-collision management, and the at least one Graphical User Interface desktop (11).

12. A method of using the apparatus of claim 1 for preventing collisions between the human transportation vehicle (1) and the movable work platform (2).

13. The method of claim 12, wherein the at least one first processor (21) compares a position of a first point of the generated cloud of points (1A) with the position and the orientation of the three dimensional model (2A), so that when a risk of collision is detected between the movable work platform (2) and the human transportation vehicle (1), a predetermined deceleration curve to mandatorily respect a predetermined minimum distance to physical contact between the human transportation vehicle (1) and the movable work platform (2) is realized.

14. The method according to claim 13, wherein the predetermined minimal distance between the movable work platform (2) and the human transportation vehicle (1) is between 100 millimeters (mm) and 200 mm.

15. A method of using the apparatus of claim 1 for realizing a Dynamic Path Planning (DPP) for the movable work platform (2) to at least partially automate manual controlled motions of the movable work platform (2) towards and along the human transportation vehicle (1) based on pre-programmed trajectories.

16. A method for generating a cloud of points (1A) representative of a real outer surface of a human transportation vehicle (1) located in a building (4) and for determining a position and an orientation of the human transportation vehicle (1) in the building, and for determining a relative position and a relative orientation of at least one a movable work platform (2) in up to 6 degrees of freedom, the method for preventing collisions between the movable work platform (2) and the human transportation vehicle (1) as defined in claim 1, said method comprising:

A) determining a known building reference point (R1) being an origin point of a 6 degrees of freedom coordinate system and serving as a central common reference point, B) determining the real outer surface of the human transportation vehicle (1) via at least one three-dimensional scanning means (3), wherein the at least one three-dimensional scanning means (3), referring to at least two building reference targets (S1, S2), each of the at least two building reference targets (S1, S2) referring to the at least one know building reference point (R1), determines a three dimensional representation of the real outer surface of the human transportation vehicle (1) as the cloud of points (1A), C) generating a cloud of points (1A) representative of the real outer surface of the human transportation vehicle (1) via at least one stationary calculator means (6), D) determining a known movable work platform reference point (R2) located on the movable work platform (2), E) setting the relative position and the relative orientation up to 6 degrees of freedom of the movable work platform (2) according to the known movable work platform reference point (R2) with respect to the known building reference point (R1) via at least one setting means (8), F) generating a three dimensional model (2A) representative of the movable work platform (2) via at least one first processor (21), G) determining a second position up to 6 degrees of freedom position and a second orientation up to 6 degrees of freedom of the three dimensional model (2A) representative of the movable work platform (2) via the at least one first processor (21), H) communicating between the three-dimensional scanning means (3), the setting means (8), the stationary calculator means (6), and the at least one first processor (21) via a communication means (30, 31, 32), and I) comparing a position of each point of the generated cloud of points (1A) with the second position and the second orientation of the three dimensional model (2A) to detect a risk of collision between the movable work platform (2) and the human transportation vehicle (1).

17. The method according to claim 16, further comprising J) respecting a predetermined deceleration curve up to mandatorily respect a predetermined minimum distance to physical contact between the human transportation vehicle (1) and the movable work platform (2) via the at least one first processor (21).

18. The method according to claim 16, wherein steps B) and C) of said method take between 60 minutes and 80 minutes.

19. The method according to claim 16, wherein steps B), C), and I) of said method have a resolution of cloud of points (1A) of the human transportation vehicle (1) between 10 millimeters (mm) and 50 mm.

20. The method according to claim 17, wherein steps B), C), I) and J) of said method have a resolution of cloud of points (1A) of the human transportation vehicle (1) between 10 millimeters (mm) and 50 mm.

* * * * *